(12) United States Patent
Bedeschi

(10) Patent No.: US 11,756,601 B2
(45) Date of Patent: *Sep. 12, 2023

(54) DIFFERENTIAL SENSING FOR A MEMORY DEVICE

(71) Applicant: Micron Technology, Inc., Boise, ID (US)

(72) Inventor: Ferdinando Bedeschi, Biassono (IT)

(73) Assignee: Micron Technology, Inc., Boise, ID (US)

(*) Notice: Subject to any disclaimer, the term of this patent is extended or adjusted under 35 U.S.C. 154(b) by 10 days.

This patent is subject to a terminal disclaimer.

(21) Appl. No.: 17/499,322

(22) Filed: Oct. 12, 2021

(65) Prior Publication Data
US 2022/0101905 A1    Mar. 31, 2022

Related U.S. Application Data

(63) Continuation of application No. 16/895,956, filed on Jun. 8, 2020, now Pat. No. 11,152,049.

(51) Int. Cl.
*G11C 11/22*    (2006.01)

(52) U.S. Cl.
CPC ........ *G11C 11/2273* (2013.01); *G11C 11/221* (2013.01)

(58) Field of Classification Search
CPC ... G11C 7/14; G11C 11/1673; G11C 11/4091; G11C 11/413; G11C 11/5642; G11C 13/004; G11C 2013/0054; G11C 2013/0042; G11C 16/26; G11C 16/28; G11C 2207/06; G11C 2207/061; G11C 2207/063; G11C 2207/065; G11C 2207/066; G11C 2207/068; G11C 2207/2281; G11C 2207/229; G11C 11/2273; G11C 11/221

See application file for complete search history.

(56) References Cited

U.S. PATENT DOCUMENTS

| | | |
|---|---|---|
| 5,487,030 A | 1/1996 | Drab et al. |
| 8,536,898 B2 * | 9/2013 | Rennie .................. G11C 7/065 327/51 |
| 9,552,864 B1 | 1/2017 | Vimercati |
| 10,192,606 B2 | 1/2019 | Vimercati |
| 10,748,596 B2 | 8/2020 | Ingalls et al. |
| 2020/0327919 A1 * | 10/2020 | Bolandrina ......... G11C 11/2293 |
| 2021/0166736 A1 * | 6/2021 | Vimercati ........... G11C 11/1657 |

* cited by examiner

*Primary Examiner* — Khamdan N. Alrobaie
(74) *Attorney, Agent, or Firm* — Holland & Hart LLP

(57) ABSTRACT

Methods, systems, and devices for differential sensing for a memory device are described. A memory device in accordance with examples as disclosed herein may include a sense component having a signal development component for generating a sense signal, a reference component for generating a reference signal, and a tail component coupled with the signal development component and the reference component. The tail component may be configured for canceling common aspects of the sense signal and the reference signal. Additionally or alternatively, a memory device in accordance with examples as disclosed herein may include a sense component having a sense amplifier configured to operate in multiple power domains, with one power domain associated with sense signal and reference signal generation and comparison, and another power domain associated with logical signal or information transfer.

20 Claims, 7 Drawing Sheets

DIFFERENTIAL SENSING FOR A MEMORY DEVICE

CROSS REFERENCE

The present application for patent is a continuation of U.S. patent application Ser. No. 16/895,956 by Bedeschi et al., entitled "DIFFERENTIAL SENSING FOR A MEMORY DEVICE," filed Jun. 8, 2020, assigned to the assignee hereof, and is expressly incorporated by reference in its entirety herein.

BACKGROUND

The following relates generally to a system that includes at least one memory device and more specifically to differential sensing for a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Memory devices may include various configurations of sense components for detecting a logic state stored by a memory cell. For example, a sense component may include a sense amplifier configured to compare a sense signal with a reference signal to determine whether a memory cell stored a logic 0 or a logic 1. A sense component may include various circuitry for generating a sense signal based at least in part on accessing a memory cell, and for generating a reference signal suitable for comparison to the sense signal to evaluate a logic state stored by the accessed memory cell. In some examples, such circuitry or signal generation may be sensitive to a size or layout of a memory array, such as a relative distance of a memory cell from a sense component, which may be associated with limitations related to scaling a memory array. Moreover, some techniques for generating or comparing sense signals and reference signals may involve voltages that are different than voltages associated with logical signal or information exchange (e.g., through the memory device, between the memory device and a host device).

In accordance with examples as disclosed herein, a memory device may include a sense component having a signal development component for generating a sense signal, a reference component for generating a reference signal, and a tail component coupled, with the signal development component and the reference component, that may be configured to cancel common aspects of the sense signal and reference signal. By canceling common aspects of signal generation, a sense component that includes such a tail component may support simplified signal generation, reduced power consumption, improved read margins, or more flexible circuitry or array layouts including larger memory arrays, among other benefits. Moreover, a sense component in accordance with examples as disclosed herein may include a sense amplifier configured to operate in multiple power domains, with one power domain associated with sense signal and reference signal generation and comparison, and another power domain associated with logical signal processing or information transfer. Including a sense amplifier operable in multiple power domains may improve design or operational flexibility for accessing memory cells and exchanging information (e.g., with a host device), or a reduction in power consumption, among other benefits.

Features of the disclosure are initially described in the context of a memory device and related circuitry as described with reference to FIGS. 1 and 2. Features of the disclosure are described in the context of memory cell characteristics, and associated circuits and access operations, as described with reference to FIGS. 3-5. These and other features of the disclosure are further illustrated by and described with reference to an apparatus diagram and a flowchart that relate to differential sensing for a memory device as described with references to FIGS. 6 and 7.

Figure 1:
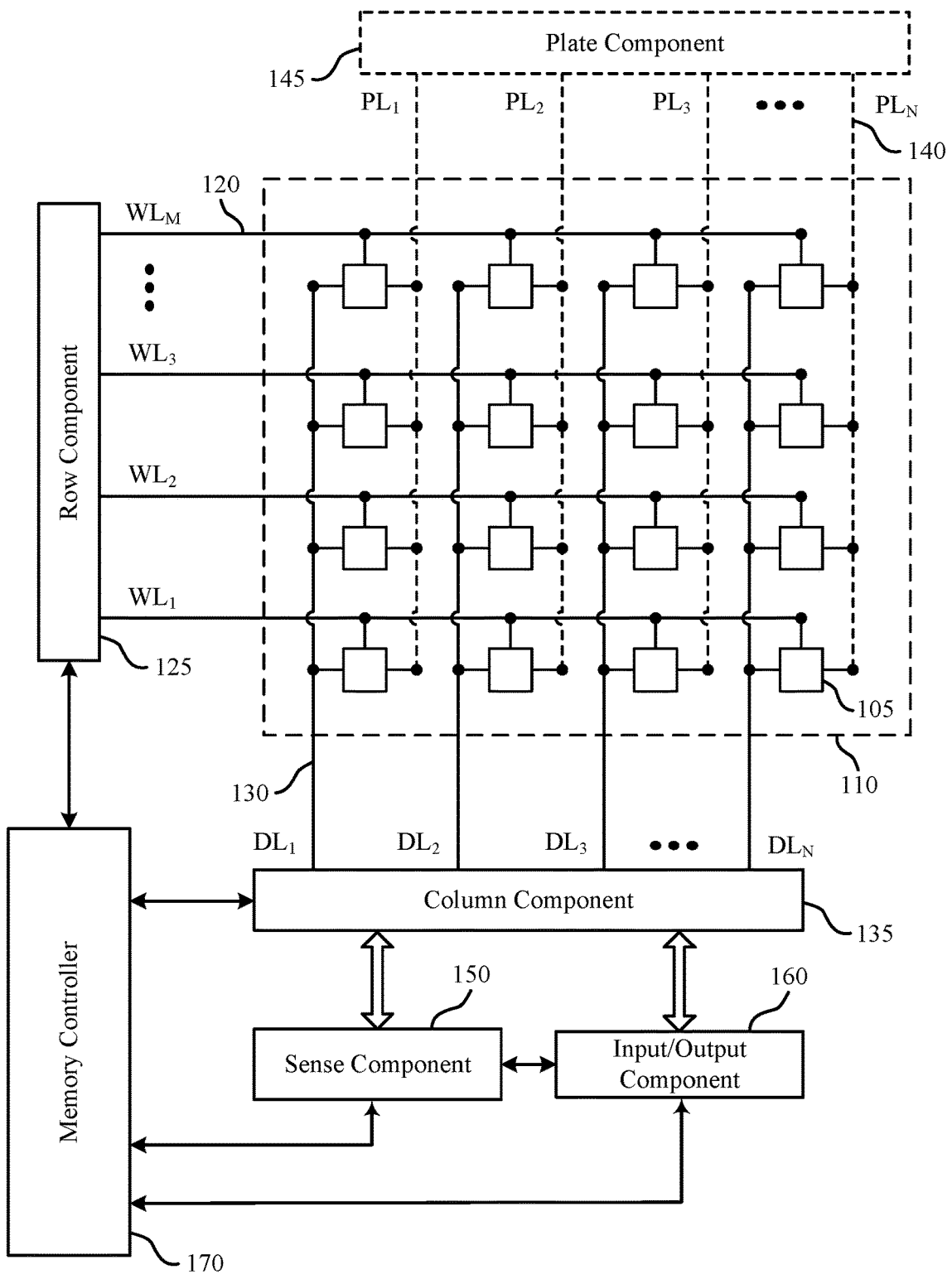
FIG. 1 illustrates an example of a memory device that supports differential sensing for a memory device in accordance with examples as disclosed herein.

FIG. 1 illustrates an example of a memory device 100 that supports differential sensing for a memory device in accordance with examples as disclosed herein. The memory device 100 may also be referred to as an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states (e.g., as a multi-level cell). The set of memory cells 105 may be part of a memory array 110 of the memory device 100 (e.g., including an array of memory cells 105), where, in some examples, a memory array 110 may refer to a contiguous tile of memory cells 105 (e.g., a contiguous set of elements of a semiconductor chip).

In some examples, a memory cell 105 may store an electric charge representative of the programmable logic states (e.g., storing charge in a capacitor, capacitive memory element, capacitive storage element). In one example, a charged and uncharged capacitor may represent two logic states, respectively. In another example, a positively charged (e.g., a first polarity, a positive polarity) and negatively charged (e.g., a second polarity, a negative polarity) capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states, which, in some examples, may support more than two logic states in a respective memory cell 105. In some examples, such as FeRAM architectures, a memory cell 105 may include a ferroelectric capacitor having a ferroelectric material as an insulating (e.g., non-conductive) layer between terminals of the capacitor. Different levels or polarities of polarization of a ferroelectric capacitor may represent different logic states (e.g., supporting two or more logic states in a respective memory cell 105).

In the example of memory device 100, each row of memory cells 105 may be coupled with one or more word lines 120 (e.g., $WL_1$ through $WL_M$), and each column of memory cells 105 may be coupled with one or more digit lines 130 (e.g., $DL_1$ through $DL_N$). Each of the word lines 120 and digit lines 130 may be an example of an access line of the memory device 100. In general, one memory cell 105 may be located at the intersection of (e.g., coupled with, coupled between) a word line 120 and a digit line 130. This intersection may be referred to as an address of a memory cell 105. A target or selected memory cell 105 may be a memory cell 105 located at the intersection of an energized or otherwise selected word line 120 and an energized or otherwise selected digit line 130.

In some architectures, a storage component of a memory cell 105 may be electrically isolated (e.g., selectively isolated) from a digit line 130 by a cell selection component, which, in some examples, may be referred to as a switching component or a selector device of or otherwise associated with the memory cell 105. A word line 120 may be coupled with the cell selection component (e.g., via a control node or terminal of the cell selection component), and may control the cell selection component of the memory cell 105. For example, the cell selection component may be a transistor and the word line 120 may be coupled with a gate of the transistor (e.g., where a gate node of the transistor may be a control node of the transistor). Activating a word line 120 may result in an electrical connection or closed circuit between a respective logic storing component of one or more memory cells 105 and one or more corresponding digit lines 130. A digit line 130 may then be accessed to read from or write to the respective memory cell 105.

In some examples, memory cells 105 may also be coupled with one or more plate lines 140 (e.g., $PL_1$ through $PL_N$). In some examples, each of the plate lines 140 may be independently addressable (e.g., supporting individual selection or biasing). In some examples, the plurality of plate lines 140 may represent or be otherwise functionally equivalent with a common plate, or other common node (e.g., a plate node common to each of the memory cells 105 in the memory array 110). When a memory cell 105 employs a capacitor for storing a logic state, a digit line 130 may provide access to a first terminal or a first plate of the capacitor, and a plate line 140 may provide access to a second terminal or a second plate of the capacitor. Although the plurality of plate lines 140 of the memory device 100 are shown as substantially parallel with the plurality of digit lines 130, in other examples, a plurality of plate lines 140 may be substantially parallel with the plurality of word lines 120, or in any other configuration (e.g., a common planar conductor, a common plate layer).

Access operations such as reading, writing, rewriting, and refreshing may be performed on a memory cell 105 by activating or selecting a word line 120, a digit line 130, or a plate line 140 coupled with the memory cell 105, which may include applying a voltage, a charge, or a current to the respective access line. Upon selecting a memory cell 105 (e.g., in a read operation), a resulting signal may be used to determine the logic state stored by the memory cell 105. For example, a memory cell 105 with a capacitive memory element storing a logic state may be selected, and the resulting flow of charge via an access line or resulting voltage of an access line may be detected to determine the programmed logic state stored by the memory cell 105.

Accessing memory cells 105 may be controlled through a row component 125 (e.g., a row decoder), a column component 135 (e.g., a column decoder), or a plate component 145 (e.g., a plate decoder), or a combination thereof. For example, a row component 125 may receive a row address from the memory controller 170 and activate the appropriate word line 120 based on the received row address. Similarly, a column component 135 may receive a column address from the memory controller 170 and activate the appropriate digit line 130. In some examples, such access operations may be accompanied by a plate component 145 biasing one or more of the plate lines 140 (e.g., biasing one of the plate lines 140, biasing some or all of the plate lines 140, biasing a common plate).

In some examples, the memory controller 170 may control operations (e.g., read operations, write operations, rewrite operations, refresh operations) of memory cells 105 through the various components (e.g., row component 125, column component 135, plate component 145, sense component 150). In some cases, one or more of the row component 125, the column component 135, the plate component 145, and the sense component 150 may be co-located or otherwise included with the memory controller 170. The memory controller 170 may generate row and column address signals to activate a desired word line 120 and digit line 130. The memory controller 170 may also generate or control various voltages or currents used during the operation of memory device 100.

In various examples, one, multiple, or all memory cells 105 within memory device 100 may be accessed simultaneously. For example, each of the memory cells 105 that share a common word line 120, or some subset of the memory cells 105 that share a common word line 120 (e.g., a common cell selection line), may be accessed simultaneously (e.g., according to a memory row access arrangement, according to a "page" access arrangement, according to a set of digit lines 130 or columns that may be accessed or sensed simultaneously). In another example, multiple memory cells 105 of memory device 100 may be accessed simultaneously during a reset operation in which some or all memory cells 105, or a group of memory cells 105 (e.g., the memory cells 105 of a memory array 110), are set to a single logic state.

A memory cell 105 may be read (e.g., sensed) by a sense component 150 when the memory cell 105 is accessed (e.g., in cooperation with the memory controller 170) to determine a logic state written to or stored by the memory cell 105. For example, the sense component 150 may be configured to evaluate a current or charge transfer through or from the memory cell 105, or a voltage resulting from coupling the memory cell 105 with the sense component 150, responsive to a read operation. The sense component 150 may provide an output signal indicative of the logic state read from the memory cell 105 to one or more components (e.g., to the column component 135, the input/output component 160, to the memory controller 170).

A sense component 150 may include various switching components, selection components, transistors, amplifiers, capacitors, resistors, or voltage sources to detect or amplify a difference in sensing signals (e.g., a difference between a read voltage and a reference voltage, a difference between a read current and a reference current, a difference between a read charge and a reference charge), which, in some examples, may be referred to as latching. In some examples, a sense component 150 may include a collection of components (e.g., circuit elements) that are repeated for each of a set of digit lines 130 connected to the sense component 150. For example, a sense component 150 may include a separate sensing circuit (e.g., a separate or duplicated sense amplifier, a separate or duplicated signal development component) for each of a set of digit lines 130 coupled with the sense component 150, such that a logic state may be separately detected for a respective memory cell 105 coupled with a respective one of the set of digit lines 130.

A memory cell 105 may be set, or written, by activating the relevant word line 120, digit line 130, or plate line 140 (e.g., via a memory controller 170). In other words, a logic state may be stored in a memory cell 105. Row component 125, column component 135, or plate component 145 may accept data, for example, via input/output component 160, to be written to the memory cells 105. In some examples, a write operation may be performed at least in part by a sense component 150, or a write operation may be configured to bypass a sense component 150.

In the case of a capacitive memory element, a memory cell 105 may be written by applying a voltage to or across a capacitor, and then isolating the capacitor (e.g., isolating the capacitor from a voltage source used to write the memory cell 105, floating the capacitor) to store a charge in the capacitor associated with a desired logic state. In the case of ferroelectric memory, a ferroelectric memory element (e.g., a ferroelectric capacitor) of a memory cell 105 may be written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage or bias may be applied across the ferroelectric memory element (e.g., grounding, virtually grounding, or equalizing a voltage across the ferroelectric memory element).

In some examples, signal development circuitry or operations associated with reading a memory cell 105 may be sensitive to a size or layout of a memory array, such as a relative distance of a memory cell 105 to the sense component 150, which may be associated with limitations related to scaling a memory array. Moreover, some techniques for generating or comparing sense signals and reference signals (e.g., at the sense component) may involve voltages that are different than voltages associated with logical signal processing or information exchange (e.g., error detection or correction operations, signal multiplexing or modulation, information transfer via the input/output component 160).

In accordance with examples as disclosed herein, the sense component 150 may include a signal development component for generating a sense signal (e.g., based at least in part on accessing a memory cell 105), a reference component for generating a reference signal (e.g., for comparison to the sense signal), and a tail component coupled with the signal development component and the reference component. The tail component may be configured to cancel common aspects of generating the sense signal and the reference signal. By canceling common aspects of signal generation, the sense component 150 may support simplified signal generation, reduced power consumption, improved read margins, or more flexible circuitry or array layouts including larger memory arrays (e.g., longer digit lines, a greater quantity of memory cells 105 along a respective digit line), among other benefits. Additionally or alternatively, the sense component 150 may include a sense amplifier configured to operate in multiple power domains, with one power domain associated with sense signal and reference signal generation and comparison, and another power domain associated with logical signal processing or information transfer (e.g., via the input/output component 160). By including a sense amplifier operable in multiple power domains, the sense component 150 may improve design or operational flexibility for accessing memory cells 105 and exchanging information (e.g., with a host device in communication with the memory device 100), or a reduction in power consumption, among other benefits.

Figure 2:
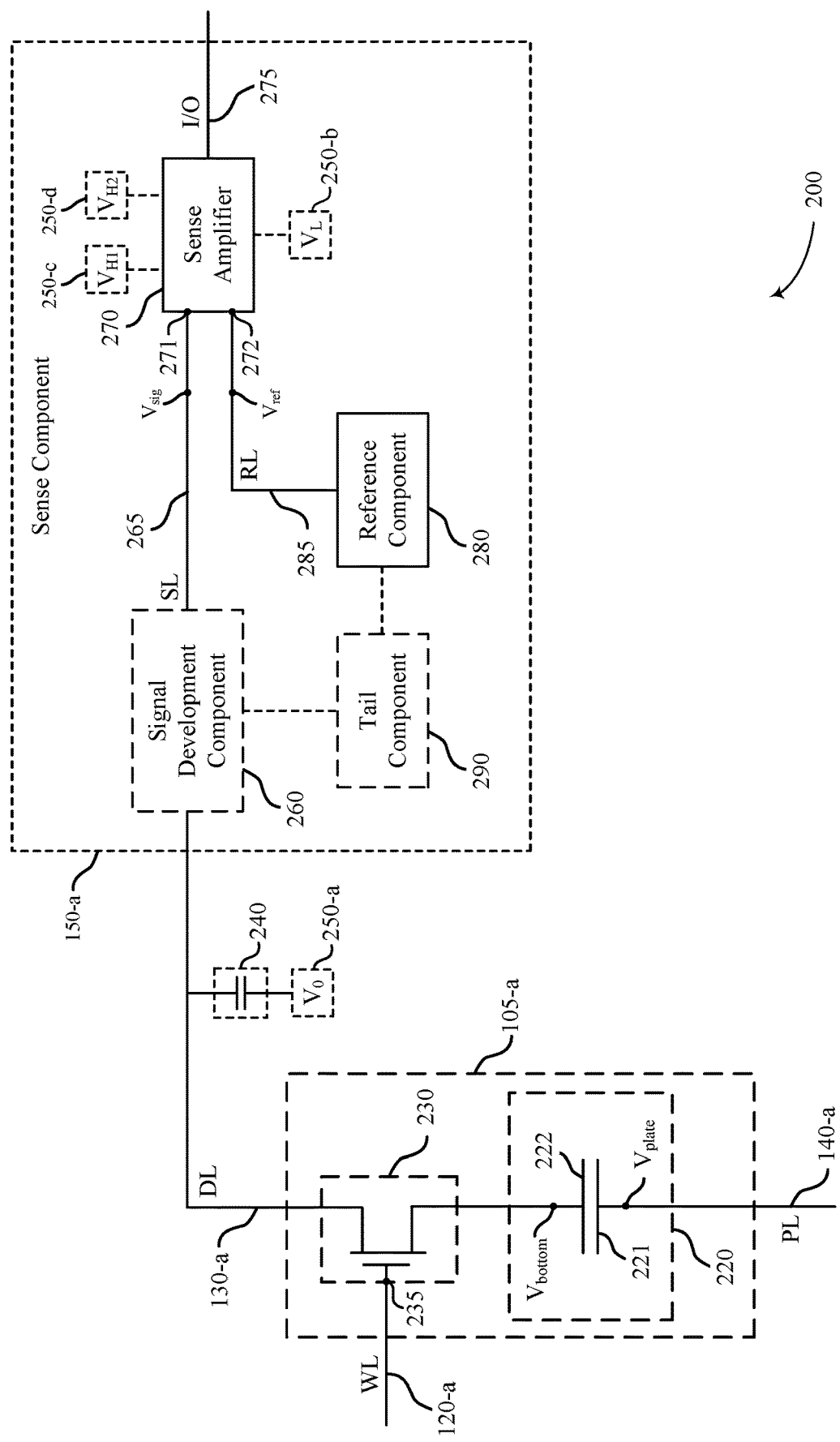
FIG. 2 illustrates an example of a circuit that supports differential sensing for a memory device in accordance with examples as disclosed herein.

FIG. 2 illustrates an example circuit 200 that supports differential sensing for a memory device in accordance with examples as disclosed herein. Circuit 200 includes a memory cell 105-a and a sense component 150-a, which may be examples of the respective components as described with reference to FIG. 1. Circuit 200 also includes a word line 120-a, a digit line 130-a, and a plate line 140-a, which may be examples of the respective access lines described with reference to FIG. 1. In various examples, the plate line 140-a may be illustrative of an independently-addressable plate line 140-a, or a common plate node (e.g., for a memory array 110 that includes the memory cell 105-a). In some memory architectures (e.g., DRAM), the plate line 140-a may be an example of a ground node, such as Vss. In other memory architectures (e.g., FeRAM), the plate line 140-a may be biased to different voltage levels during different portions of operations performed using the memory cell 105-a.

The memory cell 105-a may include a logic storage component (e.g., a memory element, a storage element, a memory storage element), such as a capacitor 220 that has a first plate, cell plate 221, and a second plate, cell bottom 222. The cell plate 221 and the cell bottom 222 may be capacitively coupled through a dielectric material positioned between them (e.g., in a DRAM application), or capacitively coupled through a ferroelectric material positioned between them (e.g., in a FeRAM application). The cell plate 221 may be associated with a voltage $V_{plate}$, and cell bottom 222 may be associated with a voltage $V_{bottom}$, as illustrated in the circuit 200. The cell plate 221 may be accessed via the plate line 140-a and cell bottom 222 may be accessed via the digit line 130-a. As described herein, various logic states may be stored by charging, discharging, or polarizing the capacitor 220.

The capacitor 220 may be electrically connected to the digit line 130-a, and the stored logic state of the capacitor 220 may be read or sensed by operating various elements represented in circuit 200. For example, the memory cell 105-a may also include a cell selection component 230 which, in some examples, may be referred to as a switching component or a selector device coupled with or between an access line (e.g., the digit line 130-a) and the capacitor 220. In some examples, a cell selection component 230 may be considered to be outside the illustrative boundary of the memory cell 105-a, and the cell selection component 230 may be referred to as a switching component or selector device coupled with or between an access line (e.g., the digit line 130-a) and the memory cell 105-a.

The capacitor 220 may be selectively coupled with the digit line 130-a when the cell selection component 230 is activated (e.g., by way of an activating logical signal), and the capacitor 220 can be selectively isolated from the digit line 130-a when the cell selection component 230 is deactivated (e.g., by way of a deactivating logical signal). A logical signal or other selection signal or voltage may be applied to a control node 235 of the cell selection component 230 (e.g., via the word line 120-a). In other words, the cell selection component 230 may be configured to selectively couple or decouple the capacitor 220 and the digit line 130-a based on a logical signal or voltage applied via the word line 120-a to the control node 235.

Activating the cell selection component 230 may be referred to as selecting or activating the memory cell 105-a, and deactivating the cell selection component 230 may be referred to as deselecting or deactivating the memory cell 105-a. In some examples, the cell selection component 230 is a transistor and its operation may be controlled by applying an activation voltage to the transistor gate (e.g., a control or selection node or terminal). The voltage for activating the transistor (e.g., the voltage between the transistor gate terminal and the transistor source terminal) may be a voltage greater than the threshold voltage magnitude of the transistor. In some examples, activating the cell selection component 230 may be referred to as selectively coupling the memory cell 105-a with the digit line 130-a.

Biasing the plate line 140-a or the digit line 130-a may result in a voltage difference (e.g., the voltage of the digit line 130-a minus the voltage of the plate line 140-a) across the capacitor 220. The voltage difference may accompany a change in the charge stored by the capacitor 220 (e.g., due to charge sharing between the capacitor 220 and the digit line 130-a, due to charge sharing between the capacitor 220 and the plate line 140-a), and the magnitude of the change in stored charge may depend on the initial state of the capacitor 220 (e.g., whether the initial charge or logic state stored a logic 1 or a logic 0).

The digit line 130-a may be coupled with additional memory cells 105 (not shown), and the digit line 130-a may have properties that result in a non-negligible intrinsic capacitance 240 (e.g., on the order of picofarads (pF)), which may couple the digit line 130-a with a voltage source 250-a. The voltage source 250-a may represent a common ground or virtual ground voltage, or the voltage of an adjacent access line of the circuit 200 (not shown). Although illustrated as a separate element in FIG. 2, the intrinsic capacitance 240 may be associated with properties distributed throughout the digit line 130-a.

The sense component 150-a may include a signal development component 260 and a sense amplifier 270 coupled with the signal development component 260 via a signal line 265. In various examples, the signal development component 260 may include circuitry configured to amplify or otherwise convert signals of the digit line 130-a prior to a logic state detection operation (e.g., by the sense amplifier 270). The signal development component 260 may include, for example, a transistor, an amplifier, a cascode, or any other circuitry configured to develop a signal for sensing a logic state stored by the memory cell 105-a. In some examples, the signal development component 260 may include a charge transfer sensing amplifier, which may include one or more transistors in a cascode or voltage control configuration.

Although the digit line 130-a and the signal line 265 are identified as separate lines, the digit line 130-a, the signal line 265, and any other lines connecting a memory cell 105 with a sense amplifier 270 may be referred to as a single access line (e.g., of or associated with the memory cell 105). Constituent portions of such an access line may be identified separately for the purposes of illustrating intervening components and intervening signals in various example configurations.

The sense amplifier 270 may include a first node 291 and a second node 292 which, in some examples, may be coupled with different access lines of a circuit (e.g., a signal line 265 and a reference line 285 of the circuit 200, respectively) or, in other examples, may be coupled with a common access line of a different circuit (not shown). In some examples, the first node 291 may be referred to as a signal node, and the second node 292 may be referred to as a reference node. However, other configurations of access lines or reference lines may be used to support the techniques described herein.

The sense amplifier 270 may include various transistors or amplifiers to detect, convert, or amplify a difference in signals, which may be referred to as latching. For example, the sense amplifier 270 may include circuit elements that receive and compare a sense signal voltage (e.g., $V_{sig}$, of the signal line 265) at a first node 291 with a reference signal voltage (e.g., $V_{ref}$, of a reference line 285) at a second node 292. A voltage of the first node 271 may be based on accessing the memory cell 105-a, such as a voltage based at least in part on a charge transfer of the capacitor 220 while the cell selection component 230 is activated. In some examples, a voltage of the second node 292 may be provided by a reference component 280. In other examples, the reference component 280 may be omitted and a reference voltage may be provided, for example, by accessing the memory cell 105-a to generate the reference voltage (e.g., in a self-referencing access operation). An output of the sense amplifier 270 may be driven to a relatively higher voltage (e.g., a positive voltage) or a relatively lower voltage (e.g., a negative voltage, a ground voltage) based on the comparison at the sense amplifier 270.

The sense amplifier 270 may output a detected logic state via one or more I/O lines 275 based on a comparison of signals at the first node 271 and the second node 272. For example, if the first node 271 has a lower voltage than the second node 272, an output of the sense amplifier 270 may be driven to a relatively lower voltage of a first sense amplifier voltage source 250-b (e.g., a voltage of $V_L$, which may be a ground voltage substantially equal to $V_0$ or a negative voltage). If the first node 271 has a higher voltage than the second node 272, an output of the sense amplifier 270 may be driven to the voltage of a second sense amplifier voltage source 250-c (e.g., a voltage of $V_H$). The sense component 150-a may latch the output of the sense amplifier 270 to determine the logic state stored in the memory cell 105-a (e.g., latching or determining a logic 0 when the first node 271 has a lower voltage than the second node 272, latching or determining a logic 1 when the first node 271 has a higher voltage than the second node 272). The latched output of the sense amplifier 270, corresponding to the detected logic state of memory cell 105-a, may be output via one or more input/output (I/O) lines (e.g., I/O line 275), which may include an output through a column component 135 or an input/output component 160 described with reference to FIG. 1.

To perform a write operation on the memory cell 105-a, a voltage may be applied across the capacitor 220 by controlling the voltage of the cell plate 221 (e.g., through the plate line 140-a) and the cell bottom 222 (e.g., through the digit line 130-a). For example, to write a logic 0, the cell plate 221 may be taken low (e.g., grounding the plate line 140-a, virtually grounding the plate line 140-a, applying a negative voltage to the plate line 140-a), and the cell bottom 222 may be taken high (e.g., applying a positive voltage to the digit line 130-a). The opposite process may be performed to write a logic 1, where the cell plate 221 is taken high and the cell bottom 222 is taken low. In some cases, the voltage applied across the capacitor 220 during a write operation may have a magnitude equal to or greater than a saturation voltage of a ferroelectric material in the capacitor 220, such that the capacitor 220 is polarized, and thus maintains a charge even when the magnitude of applied voltage is reduced, or if a zero net voltage is applied across the capacitor 220.

The circuit 200, including the sense amplifier 270, the cell selection component 230, the signal development component 260, or the reference component 280, may include various types of transistors. For example, the circuit 200 may include n-type transistors, where applying a relative positive voltage to the gate of the n-type transistor that is above a threshold voltage for the n-type transistor (e.g., an applied voltage having a positive magnitude, relative to a source terminal, that is greater than a threshold voltage) enables a conductive path between the other terminals of the n-type transistor (e.g., a drain terminal and the source terminal, across a conduction channel).

In some examples, the n-type transistor may act as a switching component, where the applied voltage is a logical signal that is used to enable conductivity through the transistor by applying a relatively high logical signal voltage (e.g., a voltage corresponding to a logic 1 state, which may be associated with a positive logical signal voltage supply), or to disable conductivity through the transistor by applying a relatively low logical signal voltage (e.g., a voltage corresponding to a logic 0 state, which may be associated with a ground or virtual ground voltage). In some examples where a n-type transistor is employed as a switching component, the voltage of a logical signal applied to the gate terminal may be selected to operate the transistor at a particular working point (e.g., in a saturation region or in an active region).

In some examples, the behavior of a n-type transistor may be more complex than a logical switching, and selective conductivity across the transistor may also be a function of varying drain and source voltages. For example, the applied voltage at the gate terminal may have a particular voltage level (e.g., a clamping voltage) that is used to enable conductivity between the drain terminal and the source terminal when the source terminal voltage is below a certain level (e.g., below the gate terminal voltage minus the threshold voltage). When the voltage of the source terminal rises above the certain level, the n-type transistor may be deactivated such that the conductive path between the drain terminal and source terminal is opened.

Additionally or alternatively, the circuit 200 may include p-type transistors, where applying a relative negative voltage to the gate of the p-type transistor that is above a threshold voltage for the p-type transistor (e.g., an applied voltage having a negative magnitude, relative to a source terminal, that is greater than a threshold voltage) enables a conductive path between the other terminals of the p-type transistor (e.g., a drain terminal and the source terminal, across a conductive channel).

In some examples, the p-type transistor may act as a switching component, where the applied voltage is a logical signal that is used to enable conductivity by applying a relatively low logical signal voltage (e.g., a voltage corresponding to a logical "1" state, which may be associated with a negative logical signal voltage supply), or to disable conductivity by applying a relatively high logical signal voltage (e.g., a voltage corresponding to a logical "0" state, which may be associated with a ground or virtual ground voltage). In some examples where a p-type transistor is employed as a switching component, the voltage of a logical signal applied to the gate terminal may be selected to operate the transistor at a particular working point (e.g., in a saturation region or in an active region).

In some examples, the behavior of a p-type transistor may be more complex than a logical switching by the gate voltage, and selective conductivity across the transistor may also be a function of varying drain and source voltages. For example, the applied voltage at the gate terminal may have a particular voltage level that is used to enable conductivity between the drain terminal and the source terminal so long as the source terminal voltage is above a certain level (e.g., above the gate terminal voltage plus the threshold voltage). When the voltage of the source terminal voltage falls below the certain level, the p-type transistor may be deactivated such that the conductive path between the drain terminal and source terminal is opened.

A transistor of the circuit 200 may be a field-effect transistor (FET), including a metal oxide semiconductor FET, which may be referred to as a MOSFET. These, and other types of transistors may be formed by doped regions of material on a substrate. In some examples, the transistor(s) may be formed on a substrate that is dedicated to a particular component of the circuit 200 (e.g., a substrate for the sense amplifier 270, a substrate for the signal development component 260, a substrate for the reference component 280, a substrate for the memory cell 105-a), or the transistor(s) may be formed on a substrate that is common for particular components of the circuit 200 (e.g., a substrate that is common to two or more of the sense amplifier 270, the signal development component 260, the reference component 280, or the memory cell 105-a). Some FETs may have a metal portion including aluminum or other metal, but some FETs may implement other non-metal materials such as polycrystalline silicon, including those FETs that may be referred to as a MOSFET. Further, although an oxide portion may be used as a dielectric portion of a FET, other non-oxide materials may be used in a dielectric material in a FET, including those FETs that may be referred to as a MOSFET.

Although the circuit 200 illustrates a set of components relative to a single memory cell 105, various components of the circuit 200 may be duplicated in a memory device 100 to support various operations. For example, to support row access or page access operations, a sense component 150 may be configured with multiples of one or more of a signal development component 260, a signal line 265, a reference component 280, a reference line 285, a sense amplifier 270, or other components, where the multiples may be configured according to a quantity of memory cells 105 that may be accessed in a row access or page access operation (e.g., in a concurrent operation).

In accordance with examples as disclosed herein, the sense component 150 may include a tail component 290 coupled with the signal development component 260 and the reference component 280. The tail component may be configured to cancel common aspects of generating a sense signal (e.g., as provided to the node 271) and reference signal (e.g., as provided to the node 272). Although illustrated as a single signal path between the tail component 290 and the signal development component 260, and a single signal path between the tail component 290 and the reference component 280, the described techniques may leverage any quantity of signal paths between the respective components, which may provide interconnection between different subcomponents, or may support different cancellation of different aspects of sense signal generation or reference signal generation. For example, the tail component 290 may support compensated amplification, controlled preamplification, compensation or cancellation of latch offset, cancelation of common modes of charge exchange, and other features. By canceling common aspects of signal generation, the sense component 150-a may support simplified signal generation, reduced power consumption, improved read margins, or more flexible circuitry or array layouts including larger memory arrays (e.g., longer digit lines, a greater quantity of memory cells 105 along a respective digit line), among other benefits.

Additionally or alternatively, the sense amplifier 270 may be configured to operate in multiple power domains. For example, a first power domain may be associated with the voltage source 250-c, and may support aspects of sense signal and reference signal generation and comparison. A second power domain may be associated with the voltage source 250-c, and may support aspects of logical signal processing or information transfer (e.g., via an input/output component 160). By supporting operation in multiple power domains, the sense amplifier 270 may support improved design or operational flexibility for accessing the memory cells 105-a and exchanging information (e.g., with a host device), or a reduction in power consumption, among other benefits.

Figure 3A:
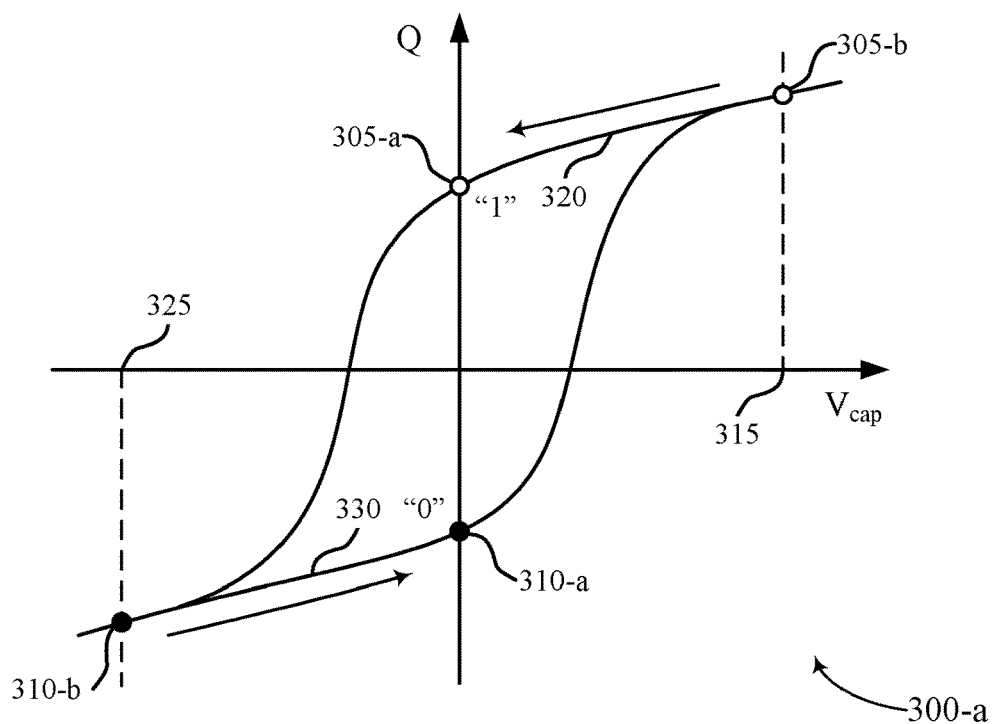
FIGS. 3A and 3B illustrate examples of non-linear electrical properties of a ferroelectric memory cell in accordance with examples as disclosed herein.
Figure 3B:
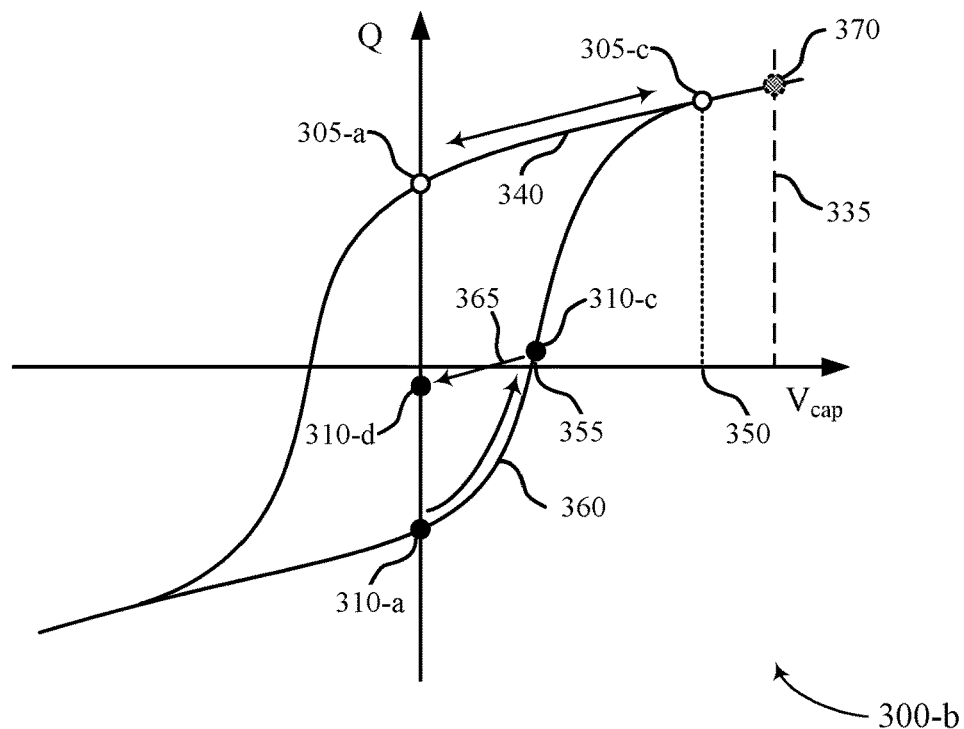

FIGS. 3A and 3B illustrate examples of non-linear electrical properties of a ferroelectric memory cell with hysteresis plots 300-a and 300-b, respectively, in accordance with various examples as disclosed herein. The hysteresis plots 300-a and 300-b may illustrate examples of a writing process and a reading process, respectively, for a memory cell 105 employing a ferroelectric capacitor 220 as described with reference to FIG. 2. The hysteresis plots 300-a and 300-b depict the charge, Q, stored on a ferroelectric capacitor 220 as a function of a voltage difference $V_{cap}$, between the terminals of the ferroelectric capacitor 220 (e.g., when charge is permitted to flow into or out of the ferroelectric capacitor 220 according to the voltage difference $V_{cap}$). For example, the voltage difference $V_{cap}$ may represent the difference in voltage between a cell bottom 222 and a cell plate 221 (e.g., $V_{bottom}-V_{plate}$, $V_{DL}-V_{PL}$).

A ferroelectric material is characterized by an electric polarization where the material may maintain a non-zero electric charge in the absence of an electric field. Examples of ferroelectric materials include barium titanate ($BaTiO_3$), lead titanate ($PbTiO_3$), lead zirconium titanate (PZT), and strontium bismuth tantalate (SBT). Ferroelectric capacitors 220 described herein may include these or other ferroelectric materials. Electric polarization within a ferroelectric capacitor 220 results in a net charge at the surface of the ferroelectric material, and attracts opposite charge through the terminals of the ferroelectric capacitor 220. Thus, charge may be stored at the interface of the ferroelectric material and the capacitor terminals.

As depicted in the hysteresis plot 300-a, a ferroelectric material used in a ferroelectric capacitor 220 may maintain a positive or negative polarization when there is no net voltage difference between the terminals of the ferroelectric capacitor 220. For example, the hysteresis plot 300-a illustrates two possible polarization states, a charge state 305-a and a charge state 310-a, which may represent a negatively saturated polarization state and a positively saturated polarization state, respectively. The charge states 305-a and 310-a may be at a physical condition illustrating remnant polarization (Pr) values, which may refer to the polarization (or charge) that remains upon removing an external bias (e.g., voltage). According to the example of the hysteresis plot 300-a, the charge state 305-a may represent a logic 1 when no voltage difference is applied across the ferroelectric capacitor 220, and the charge state 310-a may represent a logic 0 when no voltage difference is applied across the ferroelectric capacitor 220. In some examples, the logic values of the respective charge states or polarization states may be reversed or interpreted in an opposite manner to accommodate other schemes for operating a memory cell 105.

A logic 0 or 1 may be written to the memory cell 105 by controlling the electric polarization of the ferroelectric material, and thus the charge on the capacitor terminals, by applying a net voltage difference across the ferroelectric capacitor 220. For example, the voltage 315 may be a voltage equal to or greater than a positive saturation voltage, and applying the voltage 315 across the ferroelectric capacitor 220 may result in charge accumulation until the charge state 305-b is reached (e.g., writing a logic 1). Upon removing the voltage 315 from the ferroelectric capacitor 220 (e.g., applying a zero net voltage across the terminals of the ferroelectric capacitor 220), the charge state of the ferroelectric capacitor 220 may follow the path 320 shown between the charge state 305-b and the charge state 305-a at zero voltage across the capacitor. In other words, charge state 305-a may represent a logic 1 state at an equalized voltage across a ferroelectric capacitor 220 that has been positively saturated.

Similarly, voltage 325 may be a voltage equal to or lesser than a negative saturation voltage, and applying the voltage 325 across the ferroelectric capacitor 220 may result in charge accumulation until the charge state 310-b is reached (e.g., writing a logic 0). Upon removing the voltage 325 from the ferroelectric capacitor 220 (e.g., applying a zero net voltage across the terminals of the ferroelectric capacitor 220), the charge state of the ferroelectric capacitor 220 may follow the path 330 shown between the charge state 310-b and the charge state 310-a at zero voltage across the capacitor. In other words, charge state 310-a may represent a logic 0 state at an equalized voltage across a ferroelectric capacitor 220 that has been negatively saturated. In some examples, the voltage 315 and the voltage 325, representing saturation voltages, may have the same magnitude, but opposite polarity across the ferroelectric capacitor 220. Although the example of hysteresis plot 300-a illustrates a logic 0 corresponding to charge state 310-a, and a logic 1 corresponding to charge state 305-a, logic states may correspond to different charge states in some examples, such as a logic 0 corresponding to charge state 305-*a* and a logic 1 corresponding to charge state 310-*a*, among other examples.

To read, or sense, the stored state of a ferroelectric capacitor 220, a voltage may also be applied across the ferroelectric capacitor 220. In response to the applied voltage, the subsequent charge Q stored by the ferroelectric capacitor changes, and the degree of the change may depend on the initial polarization state, the applied voltages, intrinsic or other capacitance on access lines, and other factors. In other words, the charge state or access line voltage resulting from a read operation may depend on whether the charge state 305-*a*, or the charge state 310-*a*, or some other charge state was initially stored, among other factors.

The hysteresis plot 300-*b* illustrates an example for reading stored charge states 305-*a* and 310-*a*. A read voltage 335 may be applied, for example, as a voltage difference via a digit line 130-*a* and a plate line 140-*a* as described with reference to FIG. 2. The hysteresis plot 300-*b* may illustrate read operations where the read voltage 335 is positive voltage difference $V_{cap}$ (e.g., where $V_{bottom}-V_{plate}$ is positive, where $V_{DL}$ is greater than $V_{PL}$). A positive read voltage across the ferroelectric capacitor 220 may be referred to as a "plate low" read operation, where a digit line 130-*a* is taken initially to a high voltage, and a plate line 140-*a* is initially at a low voltage (e.g., a ground voltage). Although the read voltage 335 is shown as a positive voltage across the ferroelectric capacitor 220, in alternative access operations a read voltage may be a negative voltage across the ferroelectric capacitor 220, which may be referred to as a "plate high" read operation.

The read voltage 335 may be applied across the ferroelectric capacitor 220 while a memory cell 105 is selected (e.g., by activating a cell selection component 230 via a word line 120-*a* as described with reference to FIG. 2). Upon applying the read voltage 335 to the ferroelectric capacitor 220, charge may flow into or out of the ferroelectric capacitor 220 via the associated digit line 130-*a* and plate line 140-*a*, and, in some examples, different charge states or access line voltages may result depending on whether the ferroelectric capacitor 220 was at the charge state 305-*a* (e.g., storing a logic 1) or at the charge state 310-*a* (e.g., storing a logic 0), or some other charge state.

When performing a read operation on a ferroelectric capacitor 220 at the charge state 305-*a* (e.g., a logic 1), additional positive charge may accumulate across the ferroelectric capacitor 220, and the charge state may follow path 340 until reaching the charge and voltage of the charge state 305-*c*. The amount of charge flowing through the capacitor 220 may be related to the intrinsic or other capacitance of the digit line 130-*a* or other access line. In a "plate low" read configuration, a read operation associated with the charge states 305-*a* and 305-*c*, or more generally a read operation associated with the logic 1 state, may be associated with a relatively small amount of charge transfer (e.g., compared to a read operation associated with the charge states 310-*a* and 310-*c*, or more generally the logic 0 state).

As shown by the transition between the charge state 305-*a* and the charge state 305-*c*, the resulting voltage 350 across the ferroelectric capacitor 220 may be a relatively large positive value due to the relatively large change in voltage at the capacitor 220 for the given change in charge. Thus, upon reading a logic 1 in a "plate low" read operation, the digit line voltage, equal to the sum of $V_{PL}$ and $V_{cap}$ (e.g., $V_{bottom}-V_{plate}$) at the charge state 305-*c*, may be a relatively high voltage. Such a read operation may not change the remnant polarization of the ferroelectric capacitor 220 that stored the charge state 305-*a*, and thus after performing the read operation the ferroelectric capacitor 220 may return to the charge state 305-*a* via path 340 when the read voltage 335 is removed (e.g., by applying a zero net voltage across the ferroelectric capacitor 220, by equalizing the voltage across the ferroelectric capacitor 220). Thus, performing a read operation with a positive read voltage on a ferroelectric capacitor 220 with a charge state 305-*a* may be considered a non-destructive read process.

When performing the read operation on the ferroelectric capacitor 220 at the charge state 310-*a* (e.g., a logic 0), the stored charge may reverse polarity as a net positive charge accumulates across the ferroelectric capacitor 220, and the charge state may follow the path 360 until reaching the charge and voltage of the charge state 310-*c*. The amount of charge flowing through the ferroelectric capacitor 220 may again be related to the intrinsic or other capacitance of the digit line 130-*a* or other access line. In a "plate low" read configuration, a read operation associated with the charge states 310-*a* and 310-*c*, or more generally a read operation associated with the logic 0 state, may be associated with a relatively large amount of charge transfer (e.g., compared to a read operation associated with the charge states 305-*a* and 305-*c*, or more generally the logic 1 state).

As shown by the transition between the charge state 310-*a* and the charge state 310-*c*, the resulting voltage 355 may, in some cases, be a relatively small positive value due to the relatively small change in voltage at the capacitor 220 for the given change in charge. Thus, upon reading a logic 0 in a "plate low" read operation, the digit line voltage, equal to the sum of $V_{PL}$ and $V_{cap}$ (e.g., $V_{bottom}-V_{plate}$) at the charge state 310-*c*, may be a relatively plate, low voltage.

The transition from the charge state 310-*a* to the charge state 310-*d* may be illustrative of a sensing operation that is associated with a partial reduction or partial reversal in polarization or charge of a ferroelectric capacitor 220 of a memory cell 105 (e.g., a reduction in the magnitude of charge Q from the charge state 310-*a* to the charge state 310-*d*). In other words, according to the properties of the ferroelectric material, after performing the read operation the ferroelectric capacitor 220 may not return to the charge state 310-*a* when the read voltage 335 is removed (e.g., by applying a zero net voltage across the ferroelectric capacitor 220, by equalizing the voltage across the ferroelectric capacitor 220). Rather, when applying a zero net voltage across the ferroelectric capacitor 220 after a read operation of the charge state 310-*a* with read voltage 335, the charge state may follow path 365 from the charge state 310-*c* to the charge state 310-*d*, illustrating a net reduction in polarization magnitude (e.g., a less positively polarized charge state than initial charge state 310-*a*, illustrated by the difference in charge between the charge state 310-*a* and the charge state 310-*d*). Thus, performing a read operation with a positive read voltage on a ferroelectric capacitor 220 with a charge state 310-*a* may be described as a destructive read process.

The position of the charge state 305-*c* and the charge state 310-*c* after initiating a read operation may depend on a number of factors, including the specific sensing scheme and circuitry. In some cases, the final charge may depend on the net capacitance of a digit line 130-*a* coupled with the memory cell 105, which may include an intrinsic capacitance 240, an integrator capacitor (e.g., of a sense component 150), and others. For example, if a ferroelectric capacitor 220 is electrically coupled with a plate line 140-*a* at 0V and the read voltage 335 is applied to a digit line 130-*a*, the voltage of the digit line 130-*a* may fall when the memory cell 105 is selected due to charge flowing from the net capacitance of the digit line 130-*a* to the ferroelectric capacitor 220. Thus, in some examples, a voltage measured at a sense component 150 may not be equal to the read voltage 335, or the resulting voltages 350 or 355, and instead may depend on the voltage of the digit line 130-a or other access line following a period of charge sharing.

The initial state (e.g., charge state, logic state) of the ferroelectric capacitor 220 may be determined by comparing the voltage of a digit line 130-a, or signal line 265 where applicable, resulting from the read operation with a reference voltage (e.g., via a reference line 285 as described with reference to FIG. 2). In some examples, the digit line voltage may be the sum of the plate line voltage and the final voltage across the ferroelectric capacitor 220 (e.g., voltage 350 when reading the ferroelectric capacitor 220 having a stored charge state 305-a, or voltage 355 when reading the ferroelectric capacitor 220 having a stored charge state 310-a). In some examples, the digit line voltage may be the difference between the read voltage 335 and the final voltage across the capacitor 220 (e.g., (read voltage 335-voltage 350) when reading the ferroelectric capacitor 220 having a stored charge state 305-a, (read voltage 335-voltage 355) when reading the ferroelectric capacitor 220 having a stored charge state 310-a).

In some examples, read operations of a memory cell 105 may be associated with a fixed voltage of a digit line 130-a, where a charge state of a ferroelectric capacitor 220 after initiating a read operation may be the same regardless of its initial charge state. For example, in a read operation where a digit line 130-a is held at a fixed read voltage 335, the ferroelectric capacitor 220 may proceed to a charge state 370 for both the case where the ferroelectric capacitor initially stored a charge state 305-a and the case where the ferroelectric capacitor initially stored a charge state 310-a. Accordingly, rather than using a difference in voltage of a digit line 130-a to detect an initial charge state or logic state, in some examples, the initial charge state or logic state of the ferroelectric capacitor 220 may be determined based at least in part on the difference in charge associated with the read operation. For example, as illustrated by hysteresis plot 300-b, a logic 1 may be detected based on difference in charge, Q, between charge state 305-a and charge state 370 (e.g., a relatively small amount of charge transfer), and a logic 0 may be detected based on a difference in charge, Q, between charge state 310-a and charge state 370 (e.g., a relatively large amount of charge transfer).

In some examples, such a detection may be supported by a charge-transfer sensing amplifier, a cascode (e.g., a transistor configured in a cascode arrangement), or other circuitry of a signal development component 260 between a digit line 130-a and a signal line 265, and a voltage of the signal line 265 may be based at least in part on the amount of charge transfer of a capacitor 220 after initiating a read operation. In such examples, a voltage of the signal line 265 may be compared with a reference voltage (e.g., at a sense amplifier 270) to determine the logic state initially stored by the ferroelectric capacitor 220, despite a digit line 130-a being held at a fixed voltage level.

In some examples where a digit line 130-a is held at a fixed read voltage 335, a capacitor 220 may be positively saturated after a read operation irrespective of whether the capacitor 220 was initially at a charge state 305-a (e.g., a logic 1) or initially at a charge state 310-a (e.g., a logic 0). Accordingly, after such a read operation, the capacitor 220 may, at least temporarily, be charged according to a logic 1 state irrespective of its initial or intended logic state. Thus, a rewrite operation may be used at least when the capacitor 220 is intended to store a logic 0 state, and such a rewrite operation may include applying a write voltage 325 to store a logic 0 state as described with reference to hysteresis plot 300-a. Such rewrite operations may be configured or otherwise described as a selective rewrite operation, since a rewrite voltage may not need to be applied when the capacitor 220 is intended to store a logic 1 state. In some examples, such an access scheme may be referred to as a "2Pr" scheme, where the difference in charge for distinguishing a logic 0 from a logic 1 may be equal to two times the remnant polarization of a memory cell 105 (e.g., a difference in charge between charge state 305-a, a positively saturated charge state, and charge state 310-a, a negatively saturated charge state).

Figure 4:
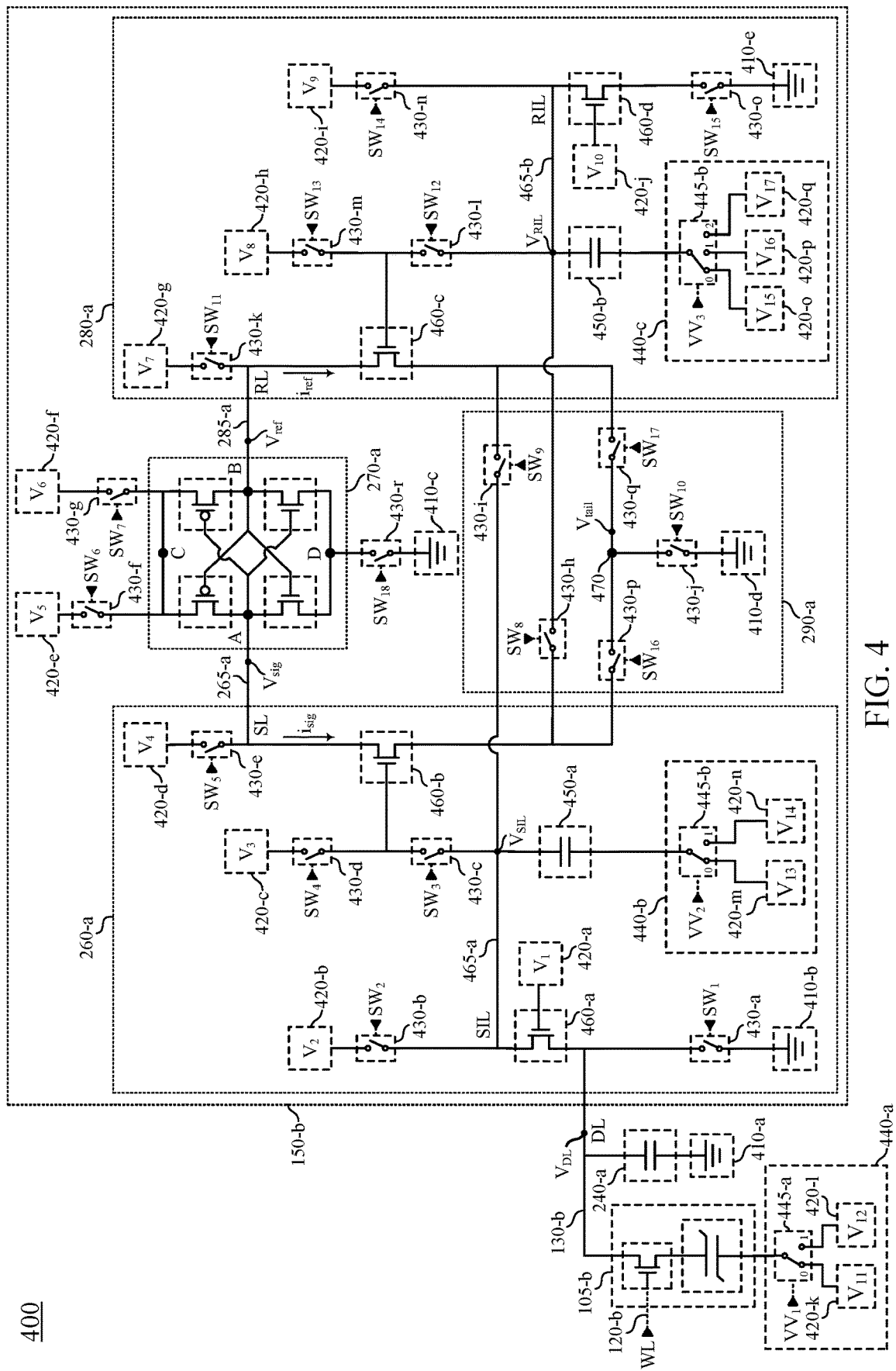
FIG. 4 illustrates an example of a circuit that supports differential sensing for a memory device in accordance with examples as disclosed herein.

FIG. 4 illustrates an example of a circuit 400 that supports differential sensing for a memory device in accordance with examples as disclosed herein. The circuit 400 includes a memory cell 105-b configured to be selectively coupled with a sense component 150-b, which may be examples of a memory cell and sense component as described with reference to FIGS. 1 through 3.

The sense component 150-b includes a signal development component 260-a, a reference component 280-a, and a tail component 290-a coupled with the signal development component 260-a and the reference component 280-a. The tail component 290-a may be configured to support canceling or compensating for common aspects of generating a sense signal and generating a reference signal. The sense component 150-b also includes a sense amplifier 270-a coupled with the signal development component 260-a and the reference component 280-a for sensing a logic state of the memory cell 105-b. Electrical charge or other signals may be communicated between the memory cell 105-b and the sense amplifier 270-a over a digit line 130-b and a signal line 265-a, which may, in combination with any other constituent signal paths, be referred to as a single access line between the memory cell 105-b and the sense amplifier 270-a. Electrical charge or other signals may be communicated between the reference component 280-a and the sense amplifier 270-a over a reference line 285-a. Signals of the access line may be illustrated by voltage $V_{DL}$ on the digit line 130-b, and $V_{sig}$ on the signal line 265-a, and $V_{ref}$ on the reference line 285-a, as shown.

The circuit 400 includes ground nodes 410, which may represent nodes that are coupled or connected with a common grounding point (e.g., a chassis ground, a neutral point, a virtual ground). The ground nodes 410 may be associated with a common reference voltage having a voltage $V_0$, from which other voltages are defined or otherwise related. The ground node 410-a, for example, may be coupled with the digit line 130-b via the intrinsic capacitance 240-a.

The circuit 400 includes voltage sources 420, which may be coupled with various voltage supplies of a memory device 100 that includes the example circuit 400. A respective voltage source 420 may be coupled with a voltage supply that is regulated or generated at a memory device 100 that includes the circuit 400, or is not regulated or generated at the memory device 100 (e.g., is regulated or otherwise supplied by a host device that is coupled with the memory device 100). In some examples, two or more of the voltage sources 420 may be coupled with the same voltage supply (e.g., a common voltage source), and may be associated with a same voltage level.

In some examples, aspects of signal cancelation or other compensation between a sense signal and a reference signal may be supported by certain voltage sources 420 of the circuit 400 being common or symmetric between the signal development component 260-a and the reference component 280-a. For example, voltage sources 420-a and 420-j may be coupled with a common source (e.g., where $V_1=V_{10}$), or voltage sources 420-b and 420-i may be coupled with a common source (e.g., where $V_2=V_9$), or voltage sources 420-c and 420-h may be coupled with a common source (e.g., where $V_3=V_8$), or voltage sources 420-d and 420-g may be coupled with a common source (e.g., where $V_4=V_7$), or various combinations thereof.

The circuit 400 includes switching components 430, which may be coupled with or between various components to provide a selective coupling, decoupling, connection, disconnection, or isolation functionality. In some examples, a switching component 430 may be a transistor (e.g., an n-type transistor, a p-type transistor), and a logical signal (e.g., $SW_n$) may be applied to a gate node of the transistor to selectively enable or disable a conductive path or channel through the transistor. As described herein, enabling a logical signal (e.g., as a logic 1) at a switching component 430 may enable a conductive path through the switching component 430 (e.g., closing a circuit path), and disabling the logical signal (e.g., as a logic 0) at the switching component 430 may disable a conductive path through the switching component 430 (e.g., opening a circuit path). Logical signals $SW_n$ may be provided by a memory controller (not shown), such as a memory controller 170 described with reference to FIG. 1, or any other component of a memory device 100 that supports access operation timing. Although the sense amplifier 270-a is shown as having direct connections with the signal development component 260-a and the reference component 280-a, in some examples, the circuit 400 may include additional switching components 430 between the respective components (e.g., isolation switches) for isolating the sense amplifier 270-a.

The circuit 400 includes variable voltage sources 440, which may include various configurations of voltage sources 420 and a respective selection component 445 controlled via a logical signal (e.g., $VV_n$). Logical signals VVn may be provided by a memory controller (not shown), such as a memory controller 170 described with reference to FIG. 1, or any other component of a memory device 100 that supports access operation timing. Although the variable voltage sources 440 are illustrated as including a certain quantity of voltage sources 420 and a selection component 445, a variable voltage source 440 supporting the operations described herein may include other configurations, such as including other quantities of voltage sources 420, or including a voltage buffer that otherwise provides a variable voltage. In some examples, a variable voltage source 440 may include two or more switching components 430 in place of a selection component 445, which may support a floating voltage condition. In other examples, a variable voltage source 440 may be replaced with fixed voltage sources, or other types of voltage sources.

In the example of circuit 400, the variable voltage source 440-a may be referred to as a plate line voltage source, and may be coupled with the memory cell 105-b via a plate line 140. The variable voltage sources 440-b and 440-c may be referred to as signal-side and reference-side boosting voltage sources, respectively. In some examples, aspects of signal cancelation or other compensation between a sense signal and a reference signal may be supported by variable voltage sources 440 being common or symmetric between the signal development component 260-a and the reference component 280-a. For example, voltage sources 420-m and 420-o may be coupled with a common source (e.g., where $V_{13}=V_{16}$), or voltage sources 420-n and 420-p may be coupled with a common source (e.g., where $V_{14}=V_{17}$). In some examples, voltage source 420-o may represent a reference voltage for generating a reference signal (e.g., for generating a reference charge or precharge of the capacitor 450-b, for generating a reference voltage of the reference line 285-b, for generating $V_{ref}$ on the reference line 285-a).

The circuit 400 includes capacitors 450, which may support accumulating, holding, or discharging a charge based on voltages applied across the respective capacitor 450. Although illustrated as a single component, each capacitor 450 may illustrate a capacitance that is distributed along a respective access line, which may include any quantity of capacitor elements or components distributed along the respective line, or an intrinsic capacitance of the respective line. In some examples, capacitor 450-a or capacitor 450-b may be referred to as an integrator capacitor or an amplifier capacitor, and may support a charge transfer sensing functionality of the circuit 400.

The circuit 400 includes transistors 460, which may support various aspects of generating a sense signal or generating a reference signal. In some examples, transistors 460 may have different operating characteristics, or different design or fabrication characteristics, than transistors that may be used in the switching components 430.

In the example of circuit 400, transistors 460-a and 460-d may be configured in or otherwise support a cascode arrangement, where a developed signal or voltage may be applied to a source node of the respective transistor 460 (e.g., as an input signal) to generate a responsive signal or voltage at a drain node of the transistor 460. In various configurations, a transistor 460 configured in a cascode arrangement may provide a conversion of charge, voltage, or other signals between the source node and the drain node, which may be based at least in part on a respective voltage source 420 coupled with a gate node of the respective transistor 460. In various examples, a transistor 460 configured in a cascode arrangement may be referred to as a voltage regulator or a bias component, relating to how the transistor 460 may regulate a flow of charge in response to a change in voltage across the transistor 460. In some examples, a transistor 460 configured in a cascode arrangement may be referred to as or be otherwise included in a charge transfer sensing amplifier.

For example, pertaining to the transistor 460-a, a signal or voltage that is based at least in part on accessing the memory cell 105-b (e.g., coupling the memory cell 105-b with the digit line 130-b) may be applied to the source node of the transistor 460-a, which may responsively generate a signal or voltage at the drain node of the transistor 460-a (e.g., a voltage, $V_{SIL}$, on a signal integrator line 465-a). In a read operation, for example, the transistor 460-a may permit a flow of charge from the signal integrator line 465-a to the digit line 130-b, which may be accompanied by a change in voltage of the signal integrator line 465-a. In some examples, a relatively small flow of charge to the digit line 130-b may be associated with a relatively small change in voltage of the signal integrator line 465-a, whereas a relatively large flow of charge to the digit line 130-b may be associated with a relatively large change in voltage of the signal integrator line 465-a. Changes in voltage of the signal integrator line 465-a associated with an access operation may be based on the net capacitance of the signal integrator line 465-a (e.g., including the capacitor 450-a), or a net capacitance of the digit line 130-b (e.g., including intrinsic capacitance 240-a and capacitance of the memory cell 105-b), or a ratio thereof.

When the memory cell 105-b includes a ferroelectric capacitor as illustrated by the hysteresis plots 300-a and 300-b of FIGS. 3A and 3B, the transistor 460-a may be configured (e.g., by way of voltage source 420-a) to maintain the voltage of the digit line 130-b to a read voltage 335. A flow of charge across the transistor 460-a (e.g., during a read operation) may correspond to or be otherwise based at least in part on the difference in charge, Q, between charge states 370 and 305-a when the memory cell 105-b stored a logic 1, and a flow of charge across the transistor 460-a may correspond to or be otherwise based at least in part on the difference in charge, Q, between charge states 370 and 310-a when the memory cell 105-b stored a logic 0.

In another example, pertaining to the transistor 460-d, a reference voltage source (e.g., ground node 410-e) may be coupled with the source node of the transistor 460-d, which may responsively generate a signal or voltage at the drain node of the transistor 460-d (e.g., a voltage, $V_{RIL}$, on a reference integrator line 465-b).

In the example of circuit 400, transistors 460-b and 460-c may be configured in or otherwise support a source follower arrangement, where a developed signal or voltage may be applied to a gate node of the respective transistor 460 (e.g., as an input signal) to generate a responsive signal or voltage at a source node of the transistor 460. In some examples, a transistor 460 configured in a source follower arrangement may provide a conversion of charge, voltage, or other signals between the gate node and the source node, which may be based at least in part on a respective voltage source 420 coupled with a drain node of the respective transistor 460. A transistor 460 configured in a source follower arrangement may be fed by a respective voltage source 420 (e.g., at a drain node), and a voltage at a source node of the transistor 460 may be equal to a voltage at the gate node of the transistor minus a threshold voltage of the transistor 460, or equal to a voltage at the drain node of the transistor 460 minus a voltage drop across a resistivity through the transistor 460 between the drain node and the source node.

In some examples, a transistor 460 may support a source follower functionality in a first operation, and support an amplification functionality in a second operation. For example, in some operations that support an amplification functionality, a developed signal or voltage may be applied to a gate node of the transistors 460-b and 460-c (e.g., as an input signal) to generate a responsive signal or voltage at a drain node of the respective transistor 460. In some examples, an amplification functionality of the transistors 460-b and 460-c may provide a conversion of charge, voltage, or other signals between the gate node and the drain node.

The tail component 290-a illustrates various conductive paths that may be configured to cancel aspects of sense signal and reference signal generation. For example, each of the signal development component 260-a and the reference component 280-a may include a respective transistor 460 (e.g., configured in a source follower arrangement), and the source nodes of the respective transistors 460 may be selectively coupled with a tail node 470 via a respective switching component 430 (e.g., switching components 430-p and 430-q, respectively). Further, the tail component 290 includes conductive paths for selectively coupling integrator lines with the source follower source nodes. For example, the switching component 430-i may be used to selectively couple the signal integrator line 465-a with the source node of transistor 460-c, and the switching component 430-h may be used to selectively couple the reference integrator line 465-b with the source node of transistor 460-b. Thus, switching components 430-h and 430-i may support a selective cross-coupling between the signal development component 260-a and the reference component 280-a. In one example, the tail component 290-a may be operated to support a cancellation of threshold voltages of transistors 460-b and 460-c from a signal comparison (e.g., including a threshold voltage component of both the transistors 460-b and 460-c in each of a developed sense signal and a developed reference signal), which may improve read margins compared to access schemes that do not cancel threshold voltage components.

The sense amplifier 270-a illustrates an example of circuitry configured to detect a logic state of the memory cell 105-a based at least in part on comparing a sense signal (e.g., of the signal line 265-a) to a reference signal (e.g., of the reference line 285-a). The sense amplifier 270-a includes a first node, A, configured to be coupled with the signal line 265-a, and a second node, B, configured to be coupled with the reference line 285-a. The sense amplifier also includes a third node, C, which may be referred to as a high sense amplifier supply node. The third node may be configured to be selectively coupled with the voltage source 420-e or the voltage source 420-f. In some examples, the voltage source 420-e may be associated with a first power domain of the sense amplifier 270-a (e.g., as an example of a voltage source 250-c described with reference to FIG. 2), and the voltage source 420-f may be associated with a second power domain of the sense amplifier 270-a (e.g., as an example of a voltage source 250-d described with reference to FIG. 2). The sense amplifier also includes a fourth node, D, which may be referred to as a low sense amplifier supply node. The fourth node may be configured to be selectively coupled with the ground node 410-c, or some other voltage source 420 (e.g., as an example of a voltage source 250-b described with reference to FIG. 2, which may or may not be a ground node). The example of sense amplifier 270-a illustrates a configuration with a pair of cross-coupled p-type transistors and a pair of cross-coupled n-type transistors. However, other configurations of a sense amplifier 270 may be used in accordance with the described techniques, including a pair of opposed differential amplifiers coupled between the first node and the second node.

Figure 5:
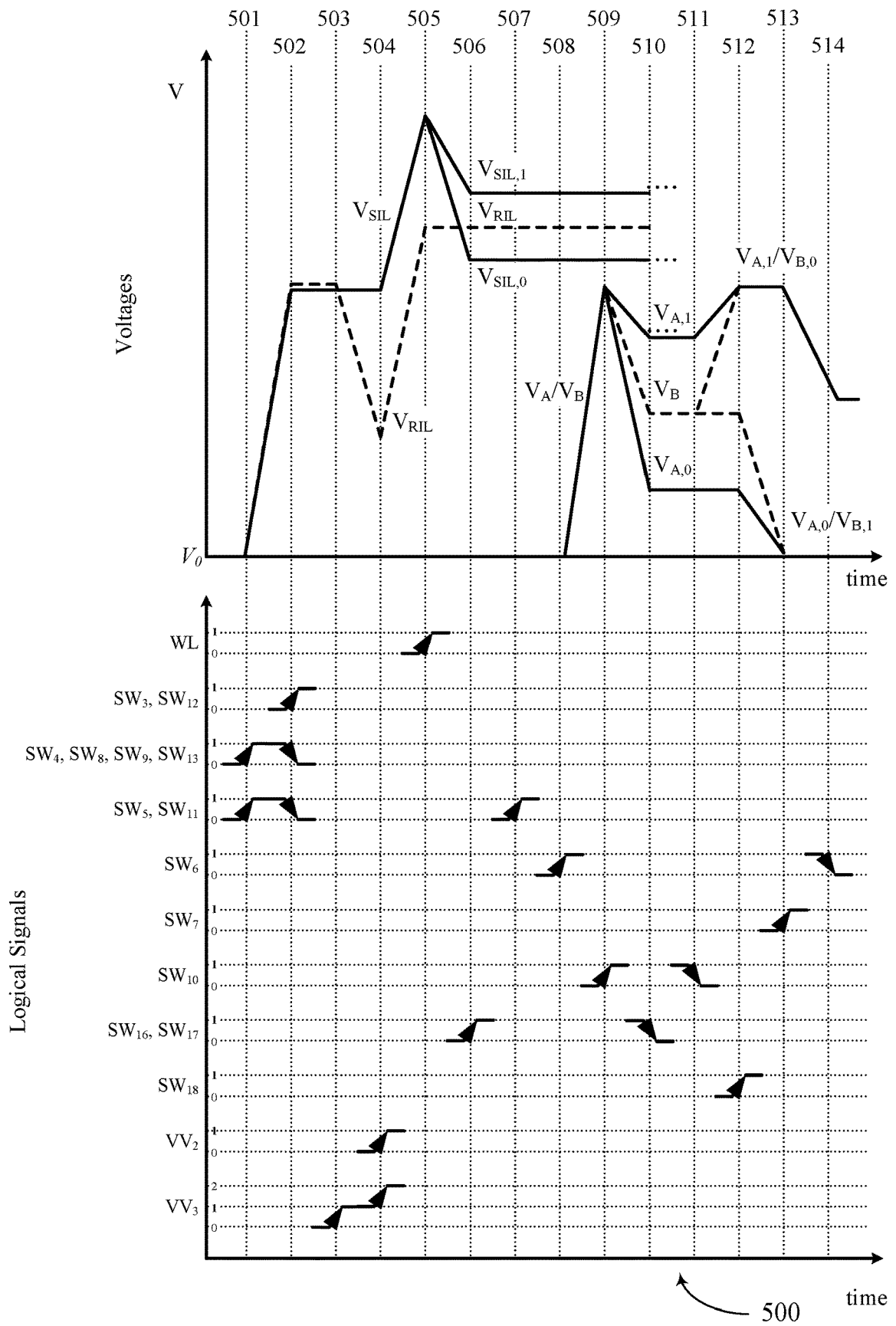
FIG. 5 shows a timing diagram illustrating operations of an example access procedure that supports differential sensing for a memory device in accordance with examples as disclosed herein.

FIG. 5 shows a timing diagram 500 illustrating operations of an example access operation that supports differential sensing for a memory device in accordance with examples as disclosed herein. The example access operation is described with reference to components of the example circuit 400 described with reference to FIG. 4.

The access operation of timing diagram 500 may be supported by certain voltage sources 420 of the circuit 400 being coupled with a same voltage supply or common voltage source. In the example of timing diagram 500, each of voltage sources 420-c, 420-d, 420-g, and 420-h may be coupled to a common voltage supply, where $V_3=V_4=V_7=V_8$ (e.g., a voltage level referred to as "VCCP"). Further, in the example of timing diagram 500, each of voltage sources 420-b and 420-i may be coupled to a common voltage supply, where $V_2=V_9$ (e.g., a voltage level referred to as "VPERI"). Further, in the example of timing diagram 500, each of voltage sources 420-a and 420-j may be coupled to a common voltage supply, where $V_1=V_{10}$ (e.g., a voltage level referred to as "VCASC," a cascode reference or set-point voltage). Further, in the example of timing diagram 500, each of voltage sources 420-n and 420-q may be coupled to a common voltage supply, where $V_{14}=V_{17}$ (e.g., a voltage level referred to as "VBOOST," an integrator capacitor boost voltage). Further, in the example of timing diagram 500, voltage sources 420-k, 420-m, and 420-o may be coupled with a ground or chassis ground, which may be the same ground or chassis ground as coupled with the ground nodes 410, where $V_{11}=V_{13}=V_{16}=0V$.

Prior to the operations of the access operation of timing diagram 500, the components of circuit 400 may be in various initial conditions. For example, each of switching components 430-d, 430-e, 430-h, 430-i, 430-k, and 430-m may be open or deactivated (e.g., deactivating logical signals $SW_4$, $SW_8$, $SW_9$, and $SW_{13}$, which may be fed by a common logical signal, deactivating logical signals $SW_5$ and $SW_{11}$). In some examples, switching components 430-c and 430-1 may also be open or deactivated (e.g., deactivating logical signals $SW_3$ and $SW_{12}$, which may be fed by a common logical signal). In some examples, logical signals $SW_3$ and $SW_{12}$ may be fed by a complement or opposite of a logical signal common to $SW_4$, $SW_8$, $SW_9$, and $SW_{13}$, in which case switching components 430-c and 430-1 may have an initial condition of being closed or activated. In some examples, switching components 430-f, 430-g, and 430-r may be deactivated, isolating the sense amplifier 270-a from voltage sources or supplies. In some examples, the variable voltage sources 440-b and 440-c may have an initial condition of being at a ground condition and reference condition, respectively, such that voltage source 420-m is coupled with the capacitor 450-a (e.g., by deactivating logical signal $VV_2$ or setting logical signal $VV_2$ with a value of 0) and such that voltage source 420-o is coupled with the capacitor 450-b (e.g., by deactivating logical signal $VV_3$ or setting logical signal $VV_3$ with a value of 0).

At 501, the access operation may include initiating an access line precharge operation. For example, logical signals $SW_4$, $SW_5$, $SW_8$, $SW_9$, $SW_{11}$, and $SW_{13}$ may be activated to close the corresponding switching components 430. As a result, voltage source 420-h may enable a conductive path through the transistor 460-c, such that voltage rises on the signal integrator line 465-a, as fed by voltage source 420-g, until $V_{SIL}$ equals $V_8$ minus a threshold voltage of the transistor 460-c (e.g., $V_{SIL}=V_8-V_{th1}$). The capacitor 450-a may accordingly be charged according to a voltage difference of $V_{SIL}$ minus the voltage of the variable voltage source 440-b (e.g., 0V). Further, voltage source 420-c may enable a conductive path through transistor 460-b, such that voltage rises on the reference integrator line 465-b, as fed by voltage source 420-d, until $V_{RIL}$ equals $V_3$ minus a threshold voltage of the transistor 460-b (e.g., $V_{RIL}=V_3-V_{th2}$). The capacitor 450-b may accordingly be charged according to a voltage difference of $V_{RIL}$ minus the voltage of the variable voltage source 440-c (e.g., $V_{15}$, a reference voltage). The operations at 501 may be an example of coupling the signal development component 260-a with the reference component 280-a (e.g., cross-coupling gate nodes of respective source follower transistors 460 and integrator lines) via the tail component 290-a (e.g., via switching components 430-h and 430-i). In some examples, logical signals $SW_3$ and $SW_{12}$ may be fed by a complement or opposite of a logical signal common to $SW_4$, $SW_8$, $SW_9$, and $SW_{13}$, in which case switching components 430-c and 430-1 may be opened or deactivated at 501.

At 502, the access operation may include operations to hold or isolate a precharge condition generated at 501. For example, logical signals $SW_4$, $SW_5$, $SW_8$, $SW_9$, $SW_{11}$, and $SW_{13}$ may be deactivated to open the corresponding switching components 430. The access operation may also include activating logical signals $SW_3$ and $SW_{12}$ to selectively couple the gate of transistor 460-b with the signal integrator line 465-a (e.g., applying $V_{SIL}$ to the gate of transistor 460-b), and selectively couple the gate of transistor 460-c with the reference integrator line 465-b (e.g., applying $V_{RIL}$ to the gate of transistor 460-c). Voltages on the signal integrator line 465-a and the reference integrator line 465-b may be largely maintained through the operations at 503.

At 503, the access operation may include dropping a voltage of the capacitor 450-b. For example, logical signal $VV_3$ may be moved to a value of 1, selectively coupling the voltage source 420-p (e.g., a ground voltage source) with the capacitor 450-b. In response, the voltage of the reference integrator line 465-b may be reduced by a value of $\alpha_c V$ (Vref) (e.g., where $V_{RIL}=V_3-V_{th2}-\alpha_c V(Vref)$), which may be a reduction based at least in part on the reference voltage of voltage source 420-o and a capacitance ratio including the capacitor 450-b. In some examples, the operations at 503 may be omitted, and the access operation may proceed from 502 to 504.

At 504, the access operation may include boosting a voltage of the capacitors 450-a and 450-b (e.g., boosting a precharge of the capacitors 450-a and 450-b). For example, logical signal $VV_2$ may be moved to a value of 1, selectively coupling the voltage source 420-n (e.g., a boost voltage source) with the capacitor 450-a. In response, the voltage of the signal integrator line 465-a may be increased by a value of $\alpha_c V(VBOOST)$ (e.g., where $V_{SIL}=V_8-V_{th1}+\alpha_c V(VBOOST)$), which may be an increase based at least in part on the boost voltage of voltage source 420-n and a capacitance ratio including the capacitor 450-a. Further, logical signal $VV_3$ may be moved to a value of 2, selectively coupling the voltage source 420-q (e.g., a boost voltage source) with the capacitor 450-b. In response, the voltage of the reference integrator line 465-b may be increased by a value of $\alpha_c V(VBOOST)$ (e.g., where $V_{RIL}=V_3-V_{th2}-\alpha_c V(Vref)+\alpha_c V(VBOOST)$), which may be an increase based at least in part on the boost voltage of voltage source 420-q and a capacitance ratio including the capacitor 450-b.

At 505, the access operation may include selecting the memory cell 105-b. For example, logical signal WL may be activated, selectively coupling the memory cell 105-b with the sense component 150-b. In some examples, an additional switching component 430 between the memory cell 105-b and the sense component 150-b (not shown), which may correspond to a column multiplexer or column component 135, may also be activated at 505 to support the selective coupling of the memory cell 105-b with the sense component 150-b. As a result, charge may flow between the digit line 130-b and the signal integrator line 465-a, as supported by the transistor 460-a. For example, charge may flow from the signal integrator line 465-a to the digit line 130-b until a voltage of the digit line 130-b returns to a voltage maintained by the transistor 460-a (e.g., $V_1$ minus a threshold voltage of the transistor 460-a). Thus, the operations at 505 may be an example of applying a read voltage 335 as described with reference to FIG. 3B.

As a result of the operations at 505, the voltage of the signal integrator line 465-a may drop by a voltage, $\Delta V(SIGNAL)$ (e.g., where $V_{SIL}=V_8-V_{th1}-\Delta V(SIGNAL)+\alpha_c V(VBOOST)$). The drop in voltage, $\Delta V(SIGNAL)$, may be based at least in part on a logic state stored by the memory cell 105-b. For example, $\Delta V(SIGNAL)$ may be associated with a difference in charge between a charge state 370 and a charge state 305-a when the memory cell 105-b stored a logic 1 (e.g., a relatively small difference in charge, a relatively small change in voltage), and $\Delta V(SIGNAL)$ may be associated with a difference in charge between a charge state 370 and a charge state 310-a when the memory cell 105-b stored a logic 0 (e.g., a relatively large difference in charge, a relatively large change in voltage). The voltage of the signal integrator line 465-a may be illustrated by $V_{SIL,0}$ when reading the memory cell 105-b storing a logic 0, and may be illustrated by $V_{SIL,1}$ when reading the memory cell 105-b storing a logic 1.

At 506, the access operation may include coupling the signal development component 260-a with the reference component 280-a (e.g., source nodes of respective source follower transistors 460) via the tail component 290-a. For example, logical signals $SW_{16}$ and $SW_{17}$ may be activated to close the corresponding switching components 430-p and 430-q. As a result, a source node of the transistor 460-b may be coupled with the tail node 470, and a source node of the transistor 460-c may be coupled with the tail node 470.

At 507, the access operation may include coupling the transistors 460-b and 460-c with respective voltage sources (e.g., enabling an amplification or source follower function of the transistors 460-b and 460-c. For example, logical signals $SW_5$ and $SW_{11}$ may be activated to close the corresponding switching components 430-e and 430-k. As a result, a drain node of the transistor 460-b may be coupled with the voltage source 420-d, and a drain node of the transistor 460-c may be coupled with the voltage source 420-g.

At 508, the access operation may include enabling a positive or high-voltage load of the sense amplifier 270-a. For example, logical signal $SW_6$ may be activated to couple the voltage source 420-e with node C of the sense amplifier 270-a. The operations at 508 may enable the sense amplifier 270-a to operate in a first power domain (e.g., associated with a relatively high voltage). In some examples, at a result of the operations at 508, nodes A and B may be coupled with the voltage source 420-e, such that corresponding voltages, $V_A$ and $V_B$, may both increase to being equal to $V_5$.

At 509, the access operation may include enabling a current path through the tail component 290-a. For example, logical signal $SW_{10}$ may be enabled to close the corresponding switching component 430-j. As a result, the tail node 470 may be coupled with the ground node 410-d, supporting current flow through the tail node 470. The current through the tail node 470 may be the sum of currents flowing through the transistors 460-b and 460-c, where the drain current through the transistors may generally be equal to the product of an amplification gain and a voltage difference between the gate voltage and threshold voltage of the respective transistor (e.g., drain current $I=gm*(V_{gate}-V_{th})$, where gm may be associated with a product of transconductance and overdrive characteristics of the transistor). Thus, the current through the transistor 460-b, $i_{sig}$, and the current through the transistor 460-c, $i_{ref}$, may be given by:

$$i_{sig}=gm*(V_{SIL}-V_{th2})=gm*(V_8-V_{th1}+\alpha_c V(VBOOST)-\Delta V(SIGNAL)-V_{th2})$$

$$i_{ref}=gm*(V_{RIL}-V_{th1})=gm*(V_3-V_{th2}-\alpha c V(Vref)+\alpha_c V(VBOOST)-V_{th1}) \quad (1)$$

Accordingly, because each of $i_{sig}$ and $i_{ref}$ include both $V_{th1}$ and $V_{th2}$, any differences in threshold voltage characteristics between the transistor 460-b and the transistor 460-c may be effectively canceled out from the difference between currents through the transistors 460-b and 460-c. Moreover, because $V_8$ and $V_3$ may be provided by a common voltage supply, any differences between voltage sources 420-c and 420-h may be effectively canceled out from the difference between currents through the transistors 460-b and 460-c. In some examples (e.g., when boost characteristics are identical or otherwise shared between the signal development component 260-a and the reference component 280-a), the boost components $\alpha_c V(VBOOST)$ may also be effectively canceled out from the difference between currents through the transistors 460-b and 460-c.

In some examples, the access operation may include generating or isolating signals at the sense amplifier 270-a based on the currents through the transistors 460-b and 460-c. For example, a voltage based at least in part on the drain current through the transistor 460-b (e.g., a drain voltage, a voltage across a shunt or access line resistance, as a voltage of the signal line 265-a) may be generated at node A of the sense amplifier 270-a, which may be based at least in part on a logic state stored at the memory cell 105-b. For example, the voltage of node A may be illustrated by $V_{A,0}$ when reading the memory cell 105-b storing a logic 0, and may be illustrated by $V_{A,1}$ when reading the memory cell 105-b storing a logic 1. In some examples, the generated voltage may be isolated at node A by an isolation switching component 430 (not shown) between node A and the signal line 265-a. Further, a voltage based at least in part on the drain current through the transistor 460-c (e.g., a drain voltage, a voltage across a shunt or access line resistance, as a voltage of the reference line 285-a) may be generated at node B of the sense amplifier 270-a, illustrated as $V_B$. In some examples, the generated voltage may be isolated at node B by an isolation switching component 430 (not shown) between node B and the reference line 285-a.

At 510, the access operation may include decoupling the signal development component 260-a from the reference component 280-a via the tail component 290-a. For example, logical signals $SW_{16}$ and $SW_{17}$ may be deactivated to open the corresponding switching components 430-p and 430-q. As a result, a source node of the transistor 460-b may be isolated from the tail node 470, and a source node of the transistor 460-c may be isolated from the tail node 470.

At 511, the access operation may include floating the tail component 290-a. For example, logical signal $SW_{10}$ may be disabled to open the corresponding switching component 430-j. As a result, the tail node 470 may be isolated from with the ground node 410-d. In some examples, as a result of the operations at 511, the one of node A or node B having a relatively higher voltage may be coupled with the voltage source 420-e by the sense amplifier 270-a. Accordingly, the operations at 511 may be a first example of supporting a comparison between the signal at node A and the signal at node B based on the first power domain of the sense amplifier 270-a (e.g., associated with the voltage source 420-e).

At 512, the access operation may include enabling a ground or low-voltage load of the sense amplifier 270-a. For example, logical signal $SW_{18}$ may be activated to couple the ground node 410-c with node D of the sense amplifier 270-a. As a result of the operations at 512, the one of node A or node B having a relatively lower voltage may be coupled with the ground node 410-c by the sense amplifier 270-a. Accordingly, the operations at 512 may be a second example of supporting a comparison between the signal at node A and the signal at node B based on the first power domain of the sense amplifier 270-a (e.g., associated with the voltage source 420-e).

At 513, the access operation may include initiating a power domain switch or transition of the sense amplifier 270-a. For example, logical signal $SW_7$ may be activated to couple the voltage source 420-f with node C of the sense amplifier 270-a. The operations at 508 may support the sense amplifier 270-a operating in a second power domain (e.g., associated with a relatively lower voltage). In some examples, as a result of the operations at 513, the one of node A or node B having a relatively higher voltage may be coupled with the voltage source 420-*f* by the sense amplifier 270-*a*, and, in some examples, a voltage of the one of node A or node B may begin decrease. In some examples, coupling the voltage source 420-*f* with node C of the sense amplifier 270-*a* while voltage source 420-*e* is coupled with node C of the sense amplifier may prevent node C from being electrically floated, and may be associated with some amount of crowbar or short circuit current.

At 514, the access operation may include completing the power domain switch or transition of the sense amplifier 270-*a*. For example, logical signal $SW_6$ may be deactivated to isolate the voltage source 420-*e* from node C of the sense amplifier 270-*a*. The operations at 508 may also support the sense amplifier 270-*a* operating in the second power domain (e.g., associated with a relatively lower voltage). In some examples, as a result of the operations at 514, the one of node A or node B having a relatively higher voltage may be isolated from the voltage source 420-*e* by the sense amplifier 270-*a*, and, in some examples, a voltage of the one of node A or node B may continue decrease until reaching a voltage of $V_6$.

Following the operations at 514, the detected logic state may be output (e.g., to logical signal processing components such as error detection, error correction, multiplexing, or modulation components, to an input/output component 160, to a host device) using a signaling voltage range that is associated with the second power domain. The power domain shift supported by the operations of 513 and 514 may provide a reduction in power consumption compared with such operations in a higher power domain, and may support increased design flexibility where a memory cell 105 operates with a higher voltage than logical signal processing or input/output components. Although the operations at 514 are shown as occurring after the operations at 513, such operations may be performed concurrently, or in an opposite order.

The order of operations shown in timing diagram 500 is for illustration purposes, and various other orders and combinations of steps may be performed to support the described techniques. Further, the timing of the operations of timing diagram 500 is also for illustration purposes, and is not meant to indicate a particular relative duration between one operation and another. Various operations may occur over a duration that is relatively shorter or relatively longer than illustrated in various examples in accordance with the present disclosure. Further, various operations illustrated in the timing diagram 500 may occur over overlapping or concurrent durations in support of the techniques described herein.

The transitions of the logical signals of the timing diagram 500 are illustrative of transitions from one state to another, and generally reflect transitions between an enabled or activated state (e.g., state "0") and a disabled or deactivated state (e.g., state "1") as associated with a particular numbered operation. In various examples the states may be associated with a particular voltage of the logical signal (e.g., a logical input voltage applied to a gate of a transistor operating as a switch), and the change in voltage from one state to another may not be instantaneous. Rather, in some examples, a voltage associated with a logical signal may follow a curve over time from one logical state to another. Thus, the transitions shown in timing diagram 500 are not necessarily indicative of an instantaneous transition. Further, the initial state of a logical signal associated with a transition at a numbered operation may have been arrived at during various times preceding the numbered operation while still supporting the described transitions and associated operations.

Figure 6:
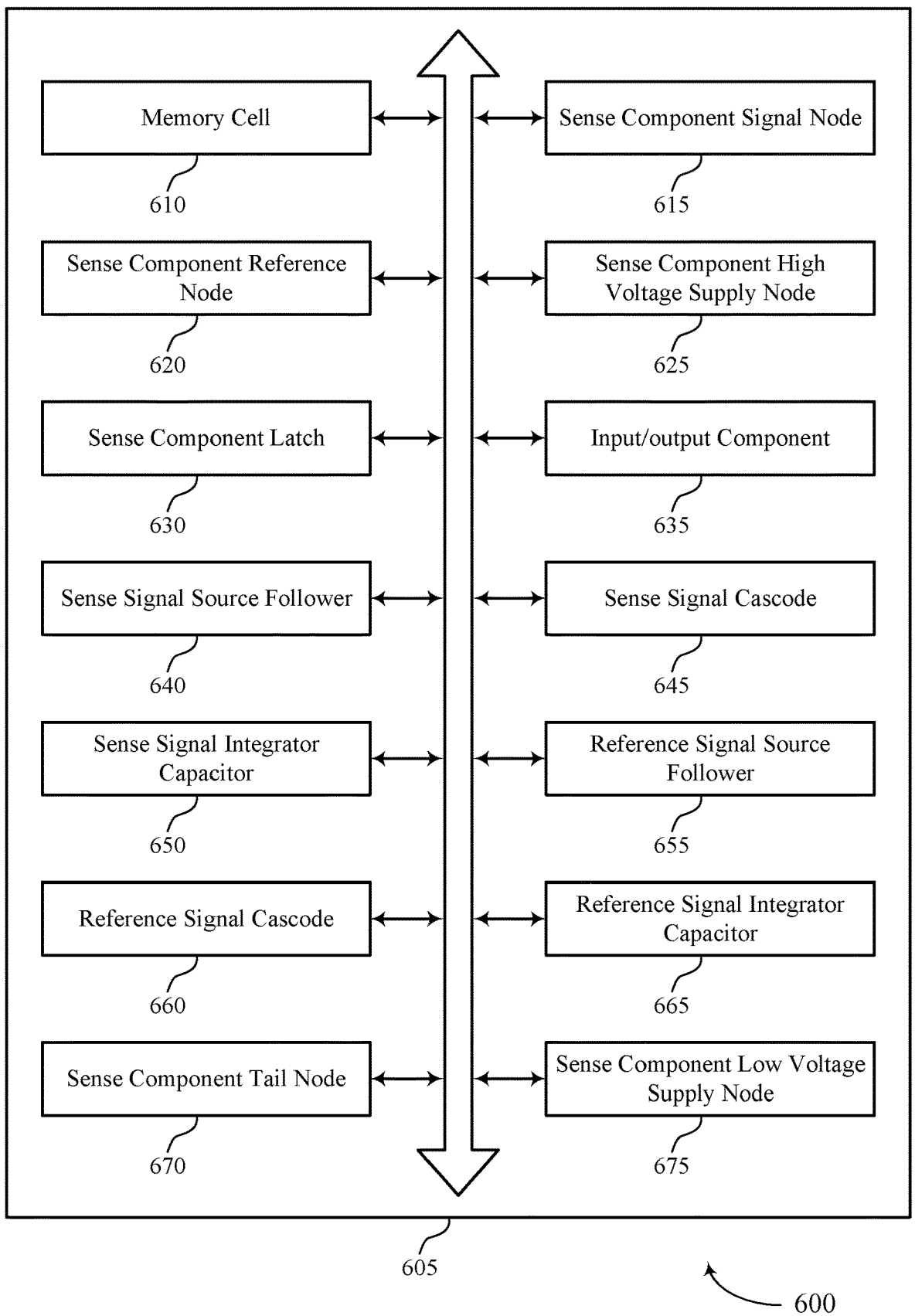
FIG. 6 shows a block diagram of a memory device that supports differential sensing for a memory device in accordance with examples as disclosed herein.

FIG. 6 shows a block diagram 600 of a memory device 605 that supports differential sensing for a memory device in accordance with examples as disclosed herein. The memory device 605 may be an example of aspects of a memory device as described with reference to FIGS. 1 through 5. The memory device 605 may include a memory cell 610, a sense component signal node 615, a sense component reference node 620, a sense component high voltage supply node 625, a sense component latch 630, an input/output component 635, a sense signal source follower 640, a sense signal cascode 645, a sense signal integrator capacitor 650, a reference signal source follower 655, a reference signal cascode 660, a reference signal integrator capacitor 665, a sense component tail node 670, and a sense component low voltage supply node 675. Each of these modules may communicate, directly or indirectly, with one another (e.g., via one or more buses). In some cases, the memory cell 610 includes a ferroelectric capacitor.

The sense component signal node 615 may receive, at a first node of a sense component of a memory device, a sense signal indicating a logic state stored by the memory cell 610.

The sense component reference node 620 may receive, at a second node of the sense component, a reference signal.

The sense component high voltage supply node 625 (e.g., a third node of the sense component) may be configured to be coupled with couple with a first supply voltage. In some examples, the sense component high voltage supply node 625 may be configured to be coupled, based on comparing a sense signal to a reference signal, with a second supply voltage.

The sense component latch 630 may compare the sense signal to the reference signal, where the comparing biases one of the first node or the second node with the first supply voltage. In some examples, the sense component latch 630 may couple the third node of the sense component with a second supply voltage, which may bias the one of the first node or the second node with the second supply voltage. In some examples, the sense component latch 630 may transmit an output signal to the input/output component 635 based on coupling the third node of the sense component with the second supply voltage.

The sense signal source follower 640 may generate the sense signal based on coupling the memory cell 610 with a gate node of a transistor that includes a drain node of the transistor coupled with the first node of the sense component. In some examples, receiving the sense signal may be based on generating the sense signal. In some examples, the sense signal source follower 640 may couple the drain node of the transistor with the first supply voltage.

The sense signal cascode 645 may couple the memory cell with the gate node of the transistor via a second transistor in a cascode configuration.

The sense signal integrator capacitor 650 (e.g., a first capacitor) may be coupled with a signal line between the gate node of the transistor and the second transistor in the cascode configuration, and may be charged before coupling the memory cell with the gate node of the transistor. In some examples, generating the sense signal may be based on charging the sense signal integrator capacitor 650.

The reference signal source follower 655 may generate the reference signal based on coupling a ground node with a gate node of a third transistor that includes a drain node of the third transistor coupled with the second node of the sense component. In some examples, receiving the reference signal may be based on generating the reference signal. In some examples, the reference signal source follower 655 may couple the drain node of the third transistor with the first supply voltage.

The reference signal cascode 660 may couple the gate node of the third transistor with the ground node via a fourth transistor in a cascode configuration.

The reference signal integrator capacitor 665 (e.g., a second capacitor) may be coupled with a reference line between the gate node of the third transistor and the fourth transistor in the cascode configuration, and may be charged before coupling the gate node of the third transistor with the ground node. In some examples, generating the reference signal may be based on charging the reference signal integrator capacitor 665.

The sense component tail node 670 may be configured to be coupled with a source node of the transistor and a source node of the third transistor. In some examples, generating the sense signal and generating the reference signal may be based on coupling the source node of the transistor with the source node of the third transistor. In some examples, the sense component tail node 670 may couple the source node of the transistor and the source node of the third transistor with the ground node. In some examples, generating the sense signal and generating the reference signal may be based on coupling the source node of the transistor and the source node of the third transistor with the ground node.

The sense component low voltage supply node 675 (e.g., a fourth node of the sense component) may be configured to be coupled with a ground node. In some examples, coupling the sense component low voltage supply node 675 with the ground node biases the other of the first node or the second node with the ground node.

Figure 7:
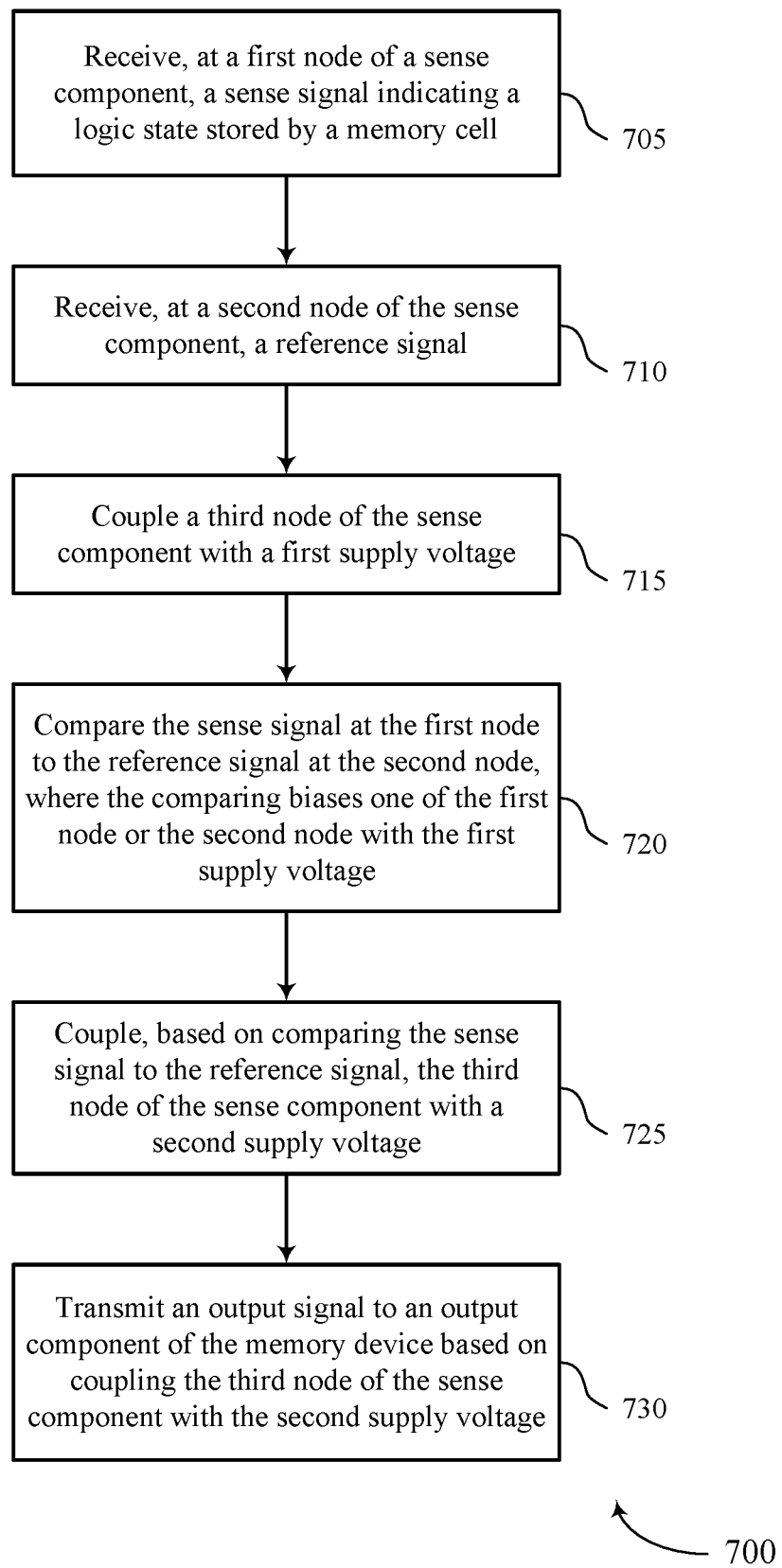
FIG. 7 shows a flowchart illustrating a method or methods that support differential sensing for a memory device in accordance with examples as disclosed herein.

FIG. 7 shows a flowchart illustrating a method or methods 700 that supports differential sensing for a memory device in accordance with examples as disclosed herein. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 705, the memory device may receive, at a first node of a sense component of the memory device, a sense signal indicating a logic state stored by a memory cell. The operations of 705 may be performed according to the methods described herein. In some examples, aspects of the operations of 705 may be performed by a sense component signal node as described with reference to FIG. 6.

At 710, the memory device may receive, at a second node of the sense component, a reference signal. The operations of 710 may be performed according to the methods described herein. In some examples, aspects of the operations of 710 may be performed by a sense component reference node as described with reference to FIG. 6.

At 715, the memory device may couple a third node of the sense component with a first supply voltage. The operations of 715 may be performed according to the methods described herein. In some examples, aspects of the operations of 715 may be performed by a sense component high voltage supply node as described with reference to FIG. 6.

At 720, the memory device may compare the sense signal to the reference signal. In some examples, the comparing biases one of the first node or the second node with the first supply voltage. The operations of 720 may be performed according to the methods described herein. In some examples, aspects of the operations of 720 may be performed by a sense component latch as described with reference to FIG. 6.

At 725, the memory device may couple, based on comparing the sense signal to the reference signal, the third node of the sense component with a second supply voltage. The operations of 725 may be performed according to the methods described herein. In some examples, aspects of the operations of 725 may be performed by a sense component high voltage supply node as described with reference to FIG. 6.

At 730, the memory device may transmit an output signal to an output component of the memory device based on coupling the third node of the sense component with the second supply voltage. The operations of 730 may be performed according to the methods described herein. In some examples, aspects of the operations of 730 may be performed by an input/output component as described with reference to FIG. 6.

In some examples, an apparatus as described herein may perform a method or methods, such as the method 700. The apparatus may include features, circuitry, means, or instructions (e.g., a non-transitory computer-readable medium storing instructions executable by a processor) for receiving, at a first node of a sense component of a memory device, a sense signal indicating a logic state stored by a memory cell, receiving, at a second node of the sense component, a reference signal, coupling a third node of the sense component with a first supply voltage, comparing the sense signal to the reference signal, where the comparing biases one of the first node or the second node with the first supply voltage, coupling, based on comparing the sense signal to the reference signal, the third node of the sense component with a second supply voltage, and transmitting an output signal to an output component of the memory device based on coupling the third node of the sense component with the second supply voltage.

In some examples of the method 700 and the apparatus described herein coupling the third node of the sense component with the second supply voltage biases the one of the first node or the second node with the second supply voltage.

Some examples of the method 700 and the apparatus described herein may further include operations, features, circuitry, means, or instructions for generating the sense signal based on coupling the memory cell with a gate node of a transistor that includes a drain node of the transistor coupled with the first node of the sense component, and receiving the sense signal may be based on generating the sense signal. In some examples of the method 700 and the apparatus described herein, generating the sense signal may include operations, features, circuitry, means, or instructions for coupling the drain node of the transistor with the first supply voltage. In some examples of the method 700 and the apparatus described herein, coupling the memory cell with the gate node of the transistor may include operations, features, circuitry, means, or instructions for coupling the memory cell with the gate node of the transistor via a second transistor in a cascode configuration. Some examples of the method 700 and the apparatus described herein may further include operations, features, circuitry, means, or instructions for charging a capacitor, coupled with a signal line between the gate node of the transistor and the second transistor in the cascode configuration, before coupling the memory cell with the gate node of the transistor, and generating the sense signal may be based on charging the capacitor.

Some examples of the method 700 and the apparatus described herein may further include operations, features, circuitry, means, or instructions for generating the reference signal based on coupling a ground node with a gate node of a third transistor that includes a drain node of the third transistor coupled with the second node of the sense component, and receiving the reference signal may be based on generating the reference signal. In some examples of the method 700 and the apparatus described herein, generating the sense signal may include operations, features, circuitry, means, or instructions for coupling the drain node of the third transistor with the first supply voltage. In some examples of the method 700 and the apparatus described herein, coupling the ground node with the gate node of the third transistor may include operations, features, circuitry, means, or instructions for coupling the gate node of the third transistor with the ground node via a fourth transistor in a cascode configuration. Some examples of the method 700 and the apparatus described herein may further include operations, features, circuitry, means, or instructions for charging a second capacitor, coupled with a reference line between the gate node of the third transistor and the fourth transistor in the cascode configuration, before coupling the gate node of the third transistor with the ground node, and generating the reference signal may be based on charging the second capacitor.

Some examples of the method 700 and the apparatus described herein may further include operations, features, circuitry, means, or instructions for coupling a source node of the transistor with a source node of the third transistor, and generating the sense signal and generating the reference signal may be based on coupling the source node of the transistor with the source node of the third transistor. Some examples of the method 700 and the apparatus described herein may further include operations, features, circuitry, means, or instructions for coupling the source node of the transistor and the source node of the third transistor with the ground node, and generating the sense signal and generating the reference signal may be based on coupling the source node of the transistor and the source node of the third transistor with the ground node.

Some examples of the method 700 and the apparatus described herein may further include operations, features, circuitry, means, or instructions for coupling a fourth node of the sense component with a ground node, and coupling the fourth node of the sense component with the ground node biases the other of the first node or the second node with the ground node. In some examples of the method 700 and the apparatus described herein, the memory cell includes a ferroelectric capacitor.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory cell and a sense component including a first node configured to receive a sense signal indicating a logic state stored by the memory cell, a second node configured to receive a reference signal, and a third node configured to selectively couple with a first voltage source and selectively couple with a second voltage source that is different than the first voltage source. The sense component may be configured to compare the sense signal to the reference signal during at least a portion of a duration that the first voltage source is coupled with the third node of the sense component, bias the first node or the second node with the first voltage source based on comparing the sense signal with the reference signal, and transmit an output signal based on coupling the third node with the second voltage source after comparing the sense signal with the reference signal.

Some examples of the apparatus may include a transistor, a drain node of the transistor coupled with the first node of the sense component, and a gate node of the transistor configured to be selectively coupled with the memory cell for generating the sense signal.

Some examples of the apparatus may include a first switching component configured to selectively couple the drain node of the transistor with the first voltage source for generating the sense signal.

Some examples of the apparatus may include a second transistor for selectively coupling the gate node of the transistor with the memory cell via a cascode configuration of the second transistor.

Some examples of the apparatus may include a capacitor coupled with the signal line and configured for generating the sense signal based on a precharge of the capacitor.

Some examples of the apparatus may include a third transistor, a drain node of the third transistor coupled with the second node of the sense component, and a gate node of the third transistor configured to be selectively coupled with a ground voltage source to generate the reference signal.

Some examples of the apparatus may include a second switching component configured to selectively couple the drain node of the third transistor with the first voltage source for generating the sense signal.

Some examples of the apparatus may include a fourth transistor for selectively coupling the gate node of the third transistor with the ground voltage source via a cascode configuration of the fourth transistor.

Some examples of the apparatus may include a second capacitor coupled with the reference line and configured for generating the reference signal based on precharging the second capacitor.

Some examples of the apparatus may include a third switching component configured to selectively couple a source node of the transistor with a source node of the third transistor (e.g., for generating the sense signal and for generating the reference signal).

Some examples of the apparatus may include a fourth switching component configured to selectively couple the source node of the transistor and the source node of the third transistor with the ground voltage source (e.g., for generating the sense signal and for generating the reference signal). In some examples, the memory cell includes a ferroelectric capacitor.

An apparatus is described. The apparatus may include a memory cell, a sense component, and circuitry coupled with the memory cell and the sense component, the circuitry configured to cause the apparatus to generate, at a first node of the sense component, a sense signal indicating a logic state stored by the memory cell, generate, at a second node of the sense component, a reference signal, couple a third node of the sense component with a first supply voltage, compare the sense signal to the reference signal, where the comparison biases one of the first node or the second node with the first supply voltage, couple, based on comparing the sense signal to the reference signal, the third node of the sense component with a second supply voltage, and transmit an output signal based on coupling the third node of the sense component with the second supply voltage.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   generating a first signal at a gate of a first transistor based at least in part on coupling a memory cell with a first access line;
   generating a second signal at a gate of a second transistor based at least in part on coupling a reference voltage source with a second access line;
   generating a third signal at a drain of the first transistor and a fourth signal at a drain of the second transistor based at least in part on generating the first signal, generating the second signal, and coupling a source of the first transistor with a source of the second transistor; and
   determining, at a sense amplifier having a first node coupled with the drain of the first transistor and a second node coupled with the drain of the second transistor, a logic state stored by the memory cell based at least in part on comparing the third signal with the fourth signal.

2. The method of claim 1, wherein:
   the third signal comprises a first voltage that is generated based at least in part on a first current through the first transistor that is associated with generating the first signal at the gate of the first transistor; and
   the fourth signal comprises a second voltage that is generated based at least in part on a second current through the second transistor that is associated with generating the second signal at the gate of the second transistor.

3. The method of claim 1, further comprising:
   coupling the source of the first transistor and the source of the second transistor with a ground node, wherein generating the third signal and the fourth signal is based at least in part on coupling the source of the first transistor and the source of the second transistor with the ground node.

4. The method of claim 1, further comprising:
   coupling the drain of the first transistor and the drain of the second transistor with a voltage source, wherein generating the third signal and the fourth signal is based at least in part on coupling the drain of the first transistor and the drain of the second transistor with the voltage source.

5. The method of claim 1, further comprising:
   coupling a drain of a third transistor with the gate of the first transistor via a third access line, the first access line coupled with a source of the third transistor, wherein generating the first signal is based at least in part on coupling the drain of the third transistor with the gate of the first transistor.

6. The method of claim 5, wherein a voltage of the first signal is based at least in part on an amount of charge transferred between the third access line and the first access line.

7. The method of claim 1, further comprising:
   coupling a drain of a fourth transistor with the gate of the second transistor, the second access line coupled with a source of the fourth transistor, wherein generating the second signal is based at least in part on coupling the drain of the fourth transistor with the gate of the second transistor.

8. An apparatus, comprising:
   a memory array comprising a plurality of memory cells; and
   circuitry coupled with the memory array and operable to:
      generate a first signal at a gate of a first transistor based at least in part on coupling a memory cell of the plurality of memory cells with a first access line;
      generate a second signal at a gate of a second transistor based at least in part on coupling a reference voltage source with a second access line; and
      generate a third signal at a drain of the first transistor and a fourth signal at a drain of the second transistor based at least in part on generating the first signal, generating the second signal, and coupling a source of the first transistor with a source of the second transistor; and
   a sense amplifier having a first node coupled with the drain of the first transistor and a second node coupled with the drain of the second transistor, the sense amplifier operable to:
      determine a logic state stored by the memory cell based at least in part on comparing the third signal with the fourth signal.

9. The apparatus of claim 8, wherein the circuitry is operable to:
   generate the third signal as a first voltage that is based at least in part on a first current through the first transistor associated with generating the first signal at the gate of the first transistor; and
   generate the fourth signal as a second voltage that is based at least in part on a second current through the second transistor associated with generating the second signal at the gate of the second transistor.

10. The apparatus of claim 8, wherein the circuitry is operable to:

generate the third signal and the fourth signal based at least in part on coupling the source of the first transistor and the source of the second transistor with a ground node.

11. The apparatus of claim 8, wherein the circuitry is operable to:
generate the third signal and the fourth signal based at least in part on coupling the drain of the first transistor and the drain of the second transistor with a voltage source.

12. The apparatus of claim 8, wherein the circuitry is operable to:
generate the first signal based at least in part on coupling a drain of a third transistor with the gate of the first transistor via a third access line, the first access line coupled with a source of the third transistor.

13. The apparatus of claim 12, wherein the circuitry is operable to:
generate a voltage of the first signal based at least in part on an amount of charge transferred between the third access line and the first access line.

14. The apparatus of claim 8, wherein the circuitry is operable to:
generate the second signal based at least in part on coupling a drain of a fourth transistor with the gate of the second transistor, the second access line coupled with a source of the fourth transistor.

15. An apparatus, comprising:
a memory cell;
a sense amplifier operable to determine a logic state stored by the memory cell based at least in part on comparing a first signal at a first node with a second signal at a second node;
a first transistor comprising a drain node coupled with the first node of the sense amplifier, and a gate node operable to receive a sense signal that is based at least in part on the logic state stored by the memory cell;
a second transistor comprising a drain node coupled with the second node of the sense amplifier, and a gate node operable to receive a reference signal;
a first switching component operable to couple a source node of the first transistor with a third node; and
a second switching component operable to couple a source node of the second transistor with the third node.

16. The apparatus of claim 15, further comprising:
a third switching component operable to couple the drain node of the first transistor with a first voltage source; and
a fourth switching component operable to couple the drain node of the second transistor with a second voltage source.

17. The apparatus of claim 15, further comprising:
a third transistor comprising a source node operable to couple with the memory cell via a first access line, and a drain node operable to couple with the gate node of the first transistor via a second access line, wherein the third transistor is configured to regulate a flow of charge between the source node of the third transistor and the drain node of the third transistor based at least in part on the logic state stored by the memory cell; and
a fourth transistor comprising a source node operable to couple with a voltage source via a third access line, and a drain node operable to couple with the gate node of the second transistor via a fourth access line.

18. The apparatus of claim 17, further comprising:
a second voltage source coupled with a gate node of the third transistor, wherein the third transistor is configured to regulate the flow of charge between the source node of the third transistor and the drain node of the third transistor based at least in part on a voltage level of the second voltage source.

19. The apparatus of claim 17, further comprising:
a variable voltage source coupled with the second access line via a capacitor.

20. The apparatus of claim 17, further comprising:
a fifth switching component operable to couple the second access line with the source node of the second transistor; and
a sixth switching component operable to couple the fourth access line with the source node of the first transistor.

* * * * *